US012575356B2

(12) United States Patent
Huang et al.

(10) Patent No.: US 12,575,356 B2
(45) Date of Patent: Mar. 10, 2026

(54) EDGE PROFILE CONTROL OF INTEGRATED CIRCUIT CHIPS

(71) Applicant: Taiwan Semiconductor Manufacturing Company, Ltd., Hsinchu (TW)

(72) Inventors: Li-Hsien Huang, Zhubei City (TW); Yao-Chun Chuang, Hsinchu City (TW); Hua-Wei Tseng, New Taipei City (TW); Yu-Jin Hu, Taoyuan City (TW); Jun He, Zhubei City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 697 days.

(21) Appl. No.: 17/833,613

(22) Filed: Jun. 6, 2022

(65) Prior Publication Data

US 2023/0170258 A1     Jun. 1, 2023

Related U.S. Application Data

(60) Provisional application No. 63/283,383, filed on Nov. 26, 2021.

(51) Int. Cl.
| | |
|---|---|
| *H01L 21/78* | (2006.01) |
| *H01L 21/56* | (2006.01) |
| *H01L 23/00* | (2006.01) |

(52) U.S. Cl.
CPC ............ *H01L 21/78* (2013.01); *H01L 21/561* (2013.01); *H01L 24/19* (2013.01); *H01L 24/20* (2013.01);

(Continued)

(58) Field of Classification Search
CPC ....... H01L 21/78; H01L 21/561; H01L 24/19; H01L 24/20; H01L 24/94; H01L 2224/214; H01L 23/528; H01L 21/56; H01L 23/585; H01L 24/05; H01L 24/12; H01L 21/568; H01L 25/0655; H01L 25/105; H01L 25/50; H01L 2221/68359; H01L 2221/68372;

(Continued)

(56) References Cited

U.S. PATENT DOCUMENTS

| | | | |
|---|---|---|---|
| 7,723,718 B1 | 5/2010 | Doan et al. | |
| 8,124,454 B1 | 2/2012 | Chu et al. | |

(Continued)

*Primary Examiner* — Jonathan Han
(74) *Attorney, Agent, or Firm* — Sterne, Kessler, Goldstein Fox, P.L.L.C.

(57) ABSTRACT

An integrated circuit chip package and a method of fabricating the same are disclosed. The method includes forming a device layer on a substrate with a first die and a second die, forming an interconnect structure on the device layer, depositing an insulating layer on the interconnect structure, forming first and second conductive pads on the interconnect structure, forming first and second conductive vias on the first and second conductive pads, respectively, patterning a polymer layer to form first and second buffer layers with tapered side profiles on the first and second conductive vias, respectively, forming a trench in the substrate and between the first and second buffer layers, and dicing the substrate through the trench to separate the first die from the second die. Portions of the first and second conductive pads extend over the insulating layer.

20 Claims, 26 Drawing Sheets

(52) U.S. Cl.
CPC ........ *H01L 24/94* (2013.01); *H01L 2224/214*
(2013.01)

(58) Field of Classification Search
CPC ..... H01L 2225/1023; H01L 2225/1035; H01L
2225/1058; H01L 21/6835; H01L 23/562;
H01L 24/24
See application file for complete search history.

(56) References Cited

U.S. PATENT DOCUMENTS

| | | | |
|---|---|---|---|
| 9,165,970 B2 | 10/2015 | Tsai et al. | |
| 9,196,532 B2 * | 11/2015 | Tu ........................... | H01L 24/05 |
| 2010/0140752 A1 * | 6/2010 | Marimuthu ......... | H01L 23/3121 |
| | | | 257/E29.112 |
| 2014/0353705 A1 * | 12/2014 | Kamikawa ....... | H10H 20/01335 |
| | | | 257/98 |
| 2021/0143208 A1 | 5/2021 | Tsai et al. | |

* cited by examiner

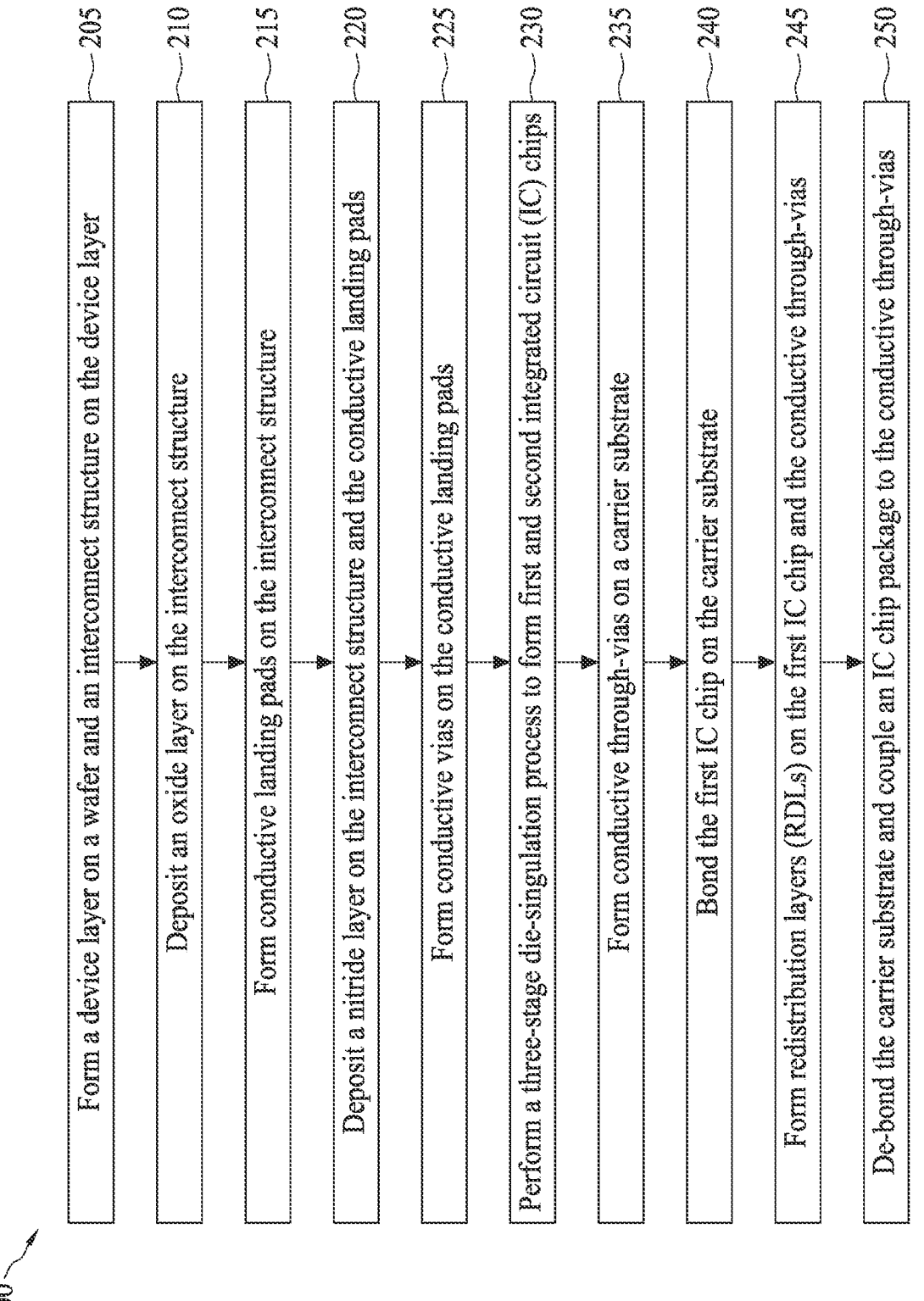

200

205 — Form a device layer on a wafer and an interconnect structure on the device layer 210 — Deposit an oxide layer on the interconnect structure 215 — Form conductive landing pads on the interconnect structure 220 — Deposit a nitride layer on the interconnect structure and the conductive landing pads 225 — Form conductive vias on the conductive landing pads 230 — Perform a three-stage die-singulation process to form first and second integrated circuit (IC) chips 235 — Form conductive through-vias on a carrier substrate 240 — Bond the first IC chip on the carrier substrate 245 — Form redistribution layers (RDLs) on the first IC chip and the conductive through-vias 250 — De-bond the carrier substrate and couple an IC chip package to the conductive through-vias

FIG. 2

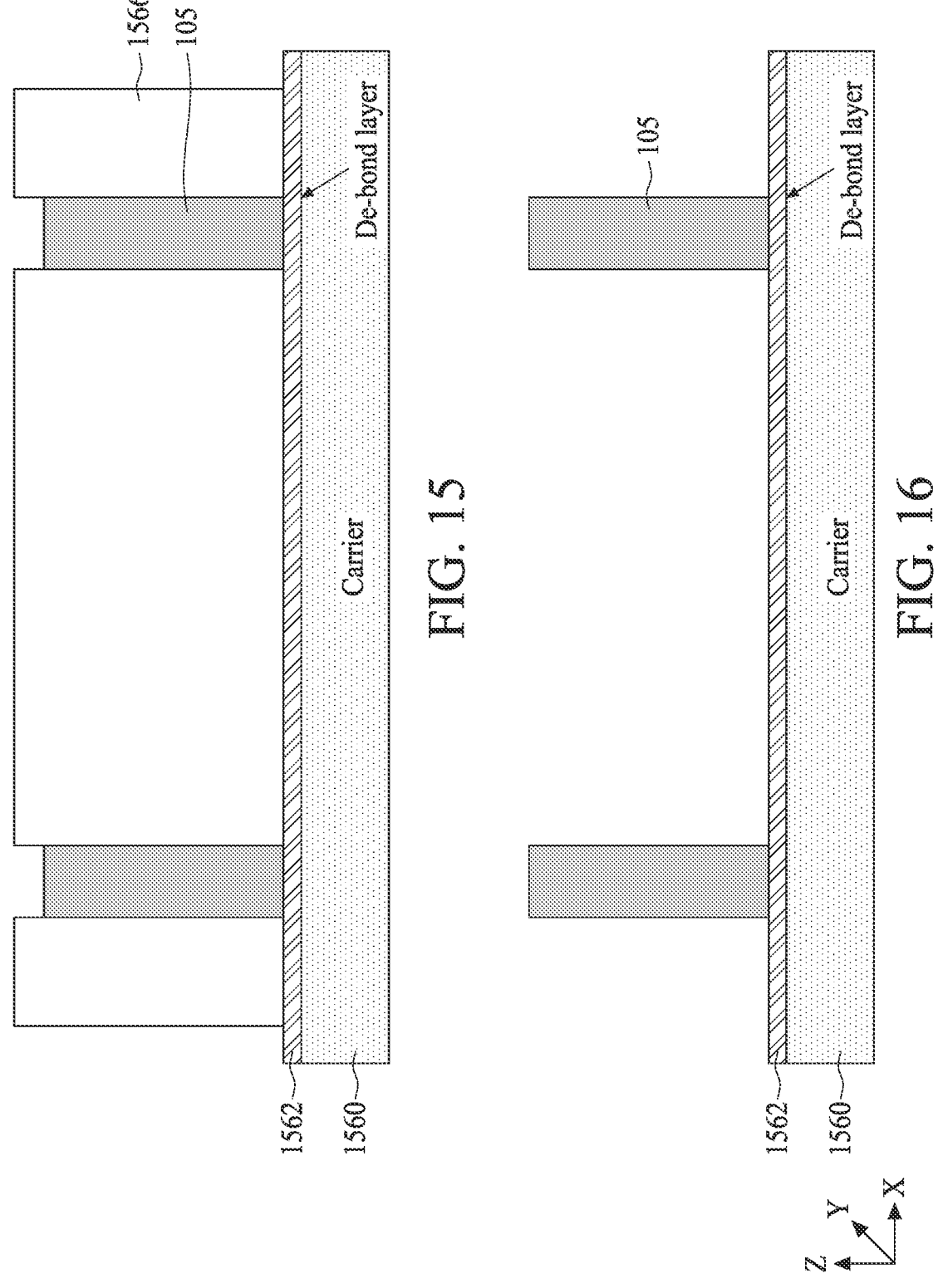

EDGE PROFILE CONTROL OF INTEGRATED CIRCUIT CHIPS

CROSS-REFERENCE TO RELATED APPLICATIONS

This application claims the benefit of U.S. Provisional Patent Application No. 63/283,383, titled "Si Die Edge Engineering Process," filed on Nov. 26, 2021, the disclosure of which is incorporated by reference herein in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs, fin field effect transistors (finFETs), and gate-all-around (GAA) FETs in integrated circuit (IC) chips. Such scaling down has increased the complexity of packaging the IC chips.

BRIEF DESCRIPTION OF THE DRAWINGS

Aspects of this disclosure are best understood from the following detailed description when read with the accompanying figures.

FIG. 2 is a flow diagram of a method for fabricating an IC chip package, in accordance with some embodiments.

FIGS. 3-21 illustrate cross-sectional views of an IC chip package at various stages of its fabrication process, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1A:
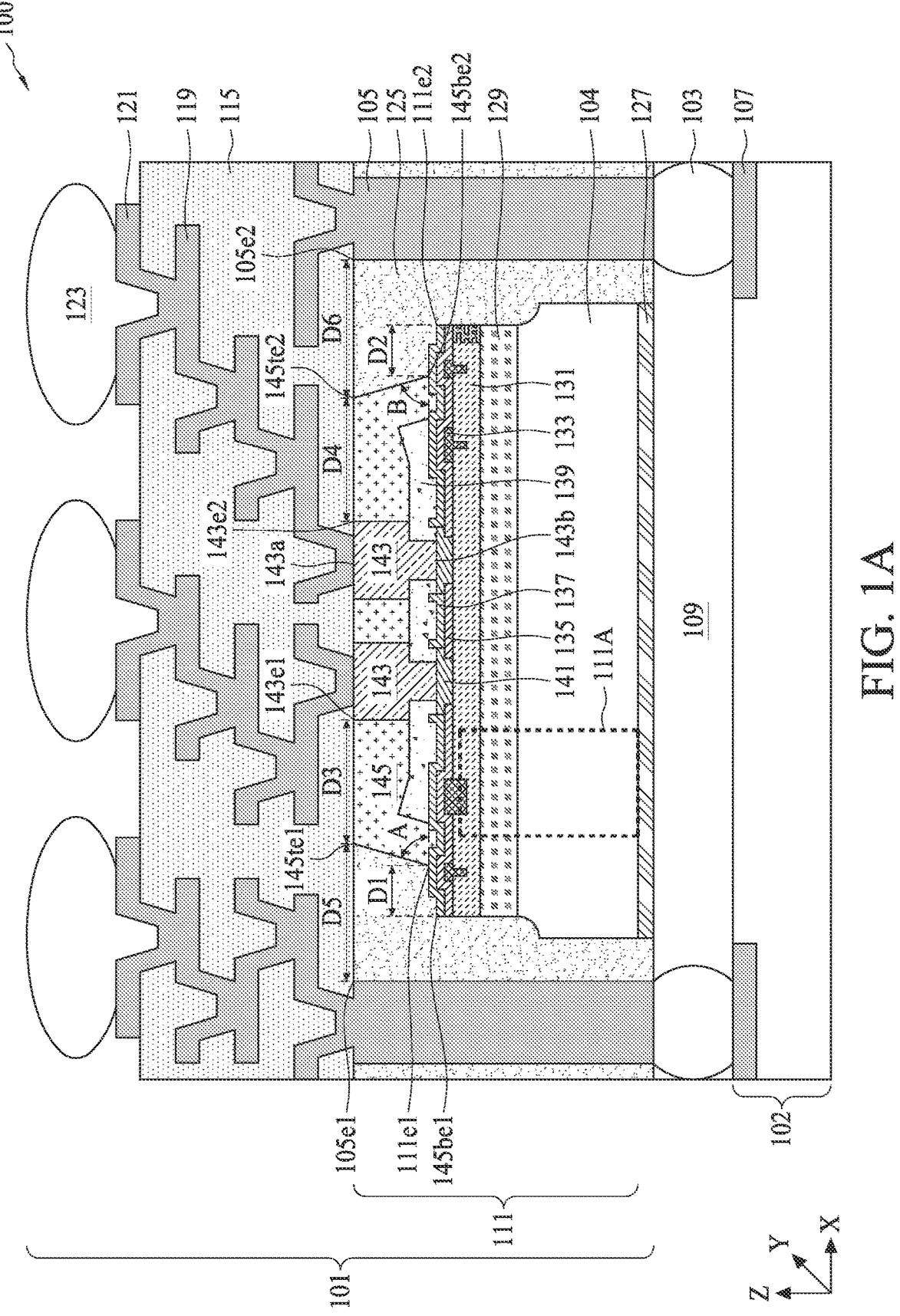
FIG. 1A illustrates a cross-sectional view of an IC chip package, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

The fin structures disclosed herein may be patterned by any suitable method. For example, the fin structures may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

The present disclosure provides example structures of IC chip packages (e.g., integrated fan-out (InFO) packages) and example methods of fabricating the same to improve IC chip reliability for higher IC chip performance. In some embodiments, the IC chip packages can include one or more IC chips, which include a device layer of semiconductor devices (e.g., GAA FETs, finFETs, or MOSFETs), interconnect structures disposed on the device layer, passivation layers disposed on the interconnect structures, and a stress buffer layer disposed on the passivation layers. In some embodiments, the example methods can include forming the device layer, interconnect structures, passivation layers, and stress buffer layer on a wafer followed by a three-stage die-singulation process and a packaging process. In some embodiments, a first stage of the die-singulation process can include removing portions of the stress buffer layer from scribe lane areas (also referred to as "scribe line areas") using a lithographic process. In some embodiments, a second stage of the die-singulation process can include forming a trench in the wafer along the scribe lane by removing portions of the passivation layers, the interconnect structures, the device layer, and wafer from the scribe lane areas using a laser grooving process. In some embodiments, a third stage of the die-singulation process can include dicing the wafer through the trench using a wafer saw process.

By using the three-stage die-singulation process having the lithographic process, a lower power density laser (e.g., about 30% to about 50% lower) can be used for the laser grooving process in the second stage compared to a laser used in a two-stage die-singulation process, which does not include a lithographic process. In the two-stage die-singulation process, a higher power density laser is used since the laser is used to remove portions of the stress buffer layer along with portions of the passivation layers, the interconnect structures, the device layer, and wafer prior to the wafer saw process. Lowering the laser power density during the three-stage die-singulation process can substantially reduce or eliminate thermal damages, such as delamination of dielectric layers in the interconnect structures and in the device layer, and formation of voids in metal lines of the interconnect structures in the IC chips formed. As a result, the IC chips formed after the three-stage die-singulation process have sharper edge profiles and about 10 times higher IC chip reliability than that of IC chips formed after the two-stage die-singulation process.

FIG. 1A illustrates a cross-sectional view of an IC chip package 100 having a first IC chip package 101 and a second IC chip package 102, according to some embodiments. In some embodiments, IC chip package 100 can have a package structure of an integrated fan-out (InFO) package-on-package (PoP) with first IC chip package 101 stacked on second IC chip package 102. In some embodiments, first IC chip package 101 and second IC chip package 102 can be similar to or different from each other. In some embodiments, first IC chip package 101 can include a system-on-chip (SoC) package and second IC chip package 102 can include a memory chip package (e.g., a dynamic random access memory (DRAM) chip package). In some embodiments, first IC chip package 101 and second IC chip package 102 can be mechanically and electrically coupled to each other through inter-package connectors 103, through-vias 105 of first IC chip package 101 and contact pads 107 of second IC chip package. In some embodiments, inter-package connectors 103 can include solder balls. In some embodiments, a sealing layer 109 can be disposed in regions between first IC chip package 101 and second IC chip package 102 that are not occupied by inter-package connectors 103. In some embodiments, sealing layer 109 can include a resin material with silica particles, an epoxy material, or other suitable sealant materials.

In some embodiments, first IC package 101 can include (i) an IC chip 111, (ii) a dielectric layer 115 disposed on a front side surface of IC chip 111, (iii) redistribution layers (RDLs) 119 disposed in dielectric layer 115, (iv) metal contact pads 121 disposed on dielectric layer 115 and in electrical contact with RDLs 119, (v) solder balls 123 disposed on metal contact pads 121, (vi) a molding layer 125 surrounding IC chip 111, (vii) conductive through-vias 105 disposed in molding layer 125 and adjacent to IC chip 111, and (viii) die attach film 127 disposed on a back side surface of IC chip 111.

In some embodiments, IC chip 111 can include (i) a substrate 104, (ii) a device layer 129 disposed on substrate 104, (iii) an interconnect structure 131, (iv) aluminum pads 133 disposed on interconnect structure 131, (v) an oxide layer 135 disposed on interconnect structure 131 and aluminum pads 133, (vi) a nitride layer 137 disposed on oxide layer 135, (vii) a polymer layer 139 disposed on nitride layer 137, (viii) conductive landing pads 141 disposed on interconnect structure 131, (ix) conductive vias 143 disposed on conductive landing pads 141, and (x) a stress buffer layer 145 disposed on polymer layer 139 and nitride layer 137.

In some embodiments, substrate 104 can be a semiconductor material, such as silicon, germanium (Ge), silicon germanium (SiGe), a silicon-on-insulator (SOI) structure, other suitable semiconductor materials, and a combination thereof. Further, substrate 104 can be doped with p-type dopants (e.g., boron, indium, aluminum, or gallium) or n-type dopants (e.g., phosphorus or arsenic). In some embodiments, device layer 129 can include semiconductor devices, such as GAA FETs, finFETs, and MOSFETs, and interconnect structure 131 can include metal lines and vias to electrically connect the semiconductor devices to each other, to other peripheral circuits, or to RDLs. The structures of device layer 129 and interconnect structure 131 within region 111A of FIG. 1A, according to some embodiments, are described with reference to FIGS. 1B-1D.

In some embodiments, conductive vias 143 can be electrically connected to interconnect structure 131 through conductive landing pads 141. In some embodiments, conductive vias 143 can include (i) a conductive material, such as copper (Cu), aluminum (Al), tungsten (W), titanium (Ti), tantalum (Ta), titanium nitride (TiN), tantalum nitride (TaN), titanium aluminum (TiAl), titanium aluminum nitride (TiAlN), and tungsten nitride (WN); (ii) a metal alloy, such as copper alloys and aluminum alloys; and (iii) a combination thereof. In some embodiments conductive vias 143 can include a titanium (Ti) liner and a copper (Cu) fill. The titanium liner can be disposed on bottom surfaces and sidewalls of conductive vias 143. In some embodiments, conductive vias 143 can have thicknesses of about 5 μm to about 30 μm along a Z-axis. Conductive vias 143 can have top surface 143a in physical contact with RDLs 119 and bottom surfaces 143b in physical contact with conductive landing pads 141. Since the landing areas of RDLs 119 connected to top surfaces 143a are larger than landing pads 141, top surfaces 143a have dimensions along an X-axis that are greater than dimension of bottom surfaces 143b along an X-axis. The wider top surfaces 143a provide adequate conductive interface between conductive vias 143 and RDLs 119. In some embodiments, conductive landing pads 141 can include aluminum.

In some embodiments, conductive vias 143 can be electrically isolated from each other by polymer layer 139, oxide layer 135, and nitride layer 137. In some embodiments, polymer layer 139 can include polybenzoxazole (PBO), benzocyclobutene (BCB), or a suitable polymer. In some embodiments, oxide layer 135 can include silicon oxide (SiO₂) or another suitable oxide-based dielectric material. In some embodiments, nitride layer 137 can include silicon nitride (SiN) or another suitable nitride-based dielectric material that can provide moisture control to interconnect structure 131 and device layer 129 during the formation of structures overlying nitride layer 137 and/or during the packing of IC chip 111.

In some embodiments, stress buffer layer 145 can mitigate the mechanical and/or thermal stress induced during packaging of IC chip 111, such as during the formation of molding layer 125, during the formation of RDLs 119, and/or during the formation of solder balls 123. In some embodiments, stress buffer layer 145 can also mitigate thermal stress induced in conductive vias 143, oxide layer 135, and/or nitride layer 137 during a three-stage die-singulation process (described in detail below) used in the formation of IC chip 111. As a result, stress buffer layer 145 can reduce the risk of delamination of oxide layer 135 and/or nitride layer 137 during the three-stage die-singulation process. In some embodiments, stress buffer layer 145 can be formed with a tapered structure, as shown in FIG. 1A, for substantially uniform distribution of stress on the underlying layers, such as oxide layer 135, nitride layer 137, and dielectric layers of interconnect structure 131. The tapered side profiles of stress buffer layer 145 can provide a more uniform distribution of stress than that provided by stress buffer layers with vertical side profiles.

In some embodiments, the tapered sidewalls of stress buffer layer 145 can form angles A and B with top surface of nitride layer 137. In some embodiments, angles A and B can be equal to or different from each other. In some embodiments, angles A and B can be greater than about 50 degrees and less than about 90 degrees. In some embodiments, a bottom edge 145be1 of stress buffer layer 145 is a distance D1 away from an edge 111e1 of IC chip 111 adjacent to bottom edge 145be1, and a bottom edge 145be2 of stress buffer layer 145 is a distance D2 away from an edge 111e2 of IC chip 111 adjacent to bottom edge 145be2. In some embodiments, distances D1 and D2 can be similar to or different from each other and can be greater than about 1 μm and less than about 30 μm. In some embodiments, a top edge 145te1 of stress buffer layer 145 is a distance D3 away from a top edge 143e1 of one of conductive vias 143 adjacent to top edge 145te1, and a top edge 145te2 of stress buffer layer 145 is a distance D4 away from a top edge 143e2 of another one of conductive vias 143 adjacent to top edge 145te2. In some embodiments, distances D3 and D4 can be similar to or different from each other and can be greater than about 20 μm and less than about 100 μm. In some embodiments, top edge 145te1 of stress buffer layer 145 is a distance D5 away from a top edge 105e1 of one of conductive through-vias 105 adjacent to top edge 145te1, and a top edge 145te2 of stress buffer layer 145 is a distance D6 away from a top edge 105e2 of another one of conductive through-vias 105 adjacent to top edge 145te2. In some embodiments, distances D5 and D6 can be similar to or different from each other and can be greater than about 100 μm and less than about 3000 μm. These dimension ranges of stress buffer layer 145 with respect to the adjacent structures can configure stress buffer layer 145 to adequately buffer and/or substantially uniformly distribute the stress induced during the packing of IC chip 111 and/or during the three-stage die-singulation process.

In some embodiments, stress buffer layer 145 can include a dielectric material, such a low-k dielectric material with a dielectric constant (k) less than about 3.5, an undoped silicate glass (USG), and a fluorinated silica glass (FSG). In some embodiments, stress buffer layer 145 can include a polymeric material, such as polyimide, polybenzoxazole (PBO), an epoxy-based polymer, a phenol-based polymer, and benzocyclobutene (BCB). In some embodiments, stress buffer layer 145 can include a photo-sensitive material, which can be patterned with a lithographic process to form the structure shown in FIG. 1A.

In some embodiments, RDLs 119 can be electrically connected to semiconductor devices of device layer 129 through conductive vias 143 and can electrically connect the semiconductor devices to second IC chip package 102 through conductive through-vias 105 and conductive vias 143. RDLs 119 can be configured to fan out IC chip 111 such that I/O connections (not shown) on IC chip 111 can be redistributed to a greater area than IC chip 111, and consequently increase the number of I/O connections of IC chip 111. In some embodiments, solder balls 123 can be electrically connected to RDLs 119 through metal contact pads 121. In some embodiments, solder balls 123 can electrically connect first IC chip package 101 to a printed circuit board (PCB).

In some embodiments, conductive through-vias 105, metal contact pads 121, and RDLs 119 can include a material similar to or different from each other. In some embodiments, conductive through-vias 105, metal contact pads 121, and RDLs 119 can include a metal (such as copper and aluminum), a metal alloy (such as copper alloy and aluminum alloy), or a combination thereof. In some embodiments conductive through-vias 105, metal contact pads 121, and RDLs 119 can include a titanium liner and a copper fill. The titanium liner can be disposed on bottom surfaces and sidewalls of conductive through-vias 105, metal contact pads 121, and RDLs 119. In some embodiments, dielectric layer 115 can include a stack of dielectric layers. In some embodiments, molding layer 125 can include a resin material or an epoxy material.

Figure 1B:
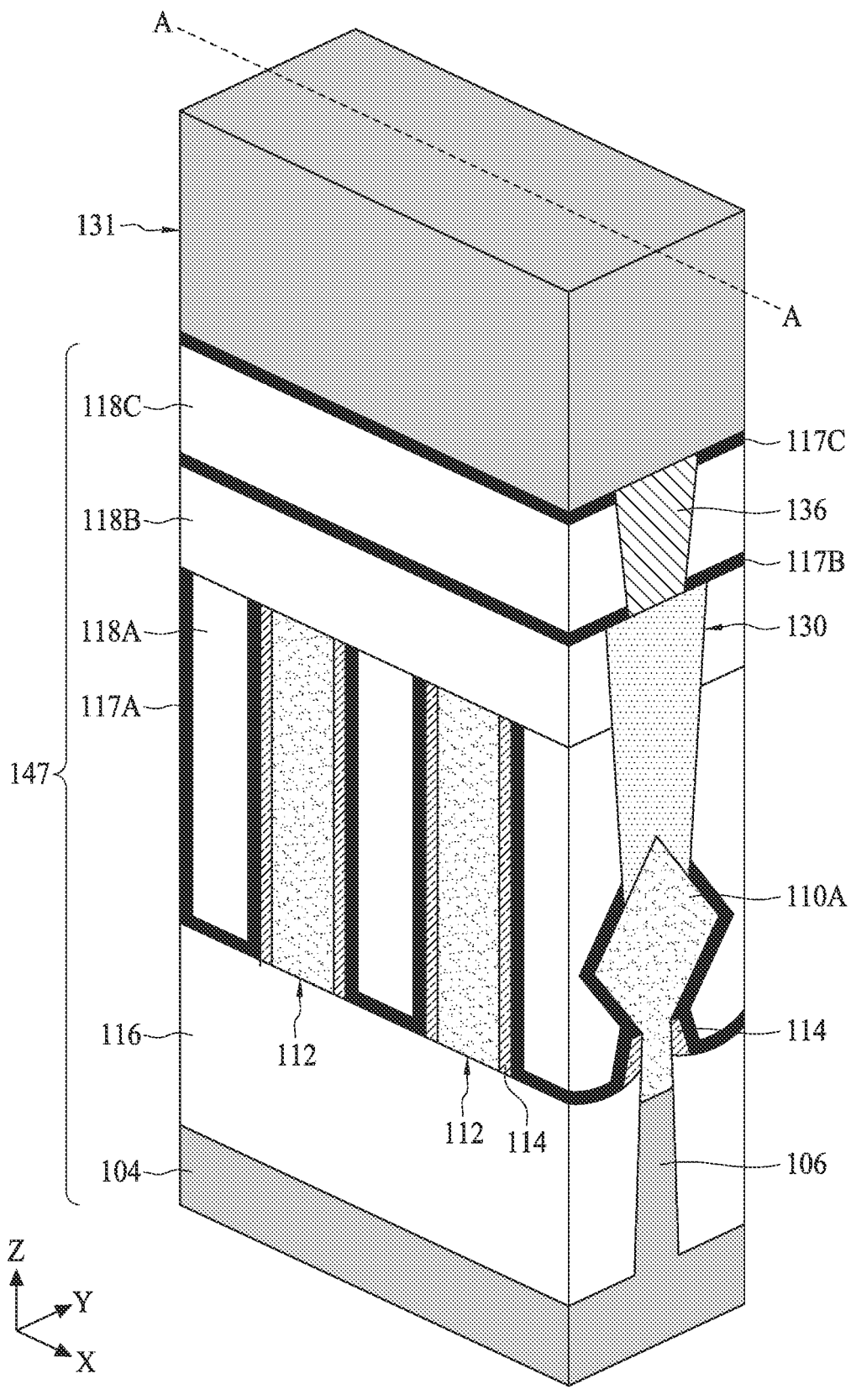
FIGS. 1B-1D illustrate isometric and cross-sectional views of a semiconductor device and an interconnect structure of an IC chip package, in accordance with some embodiments.
Figure 1C:
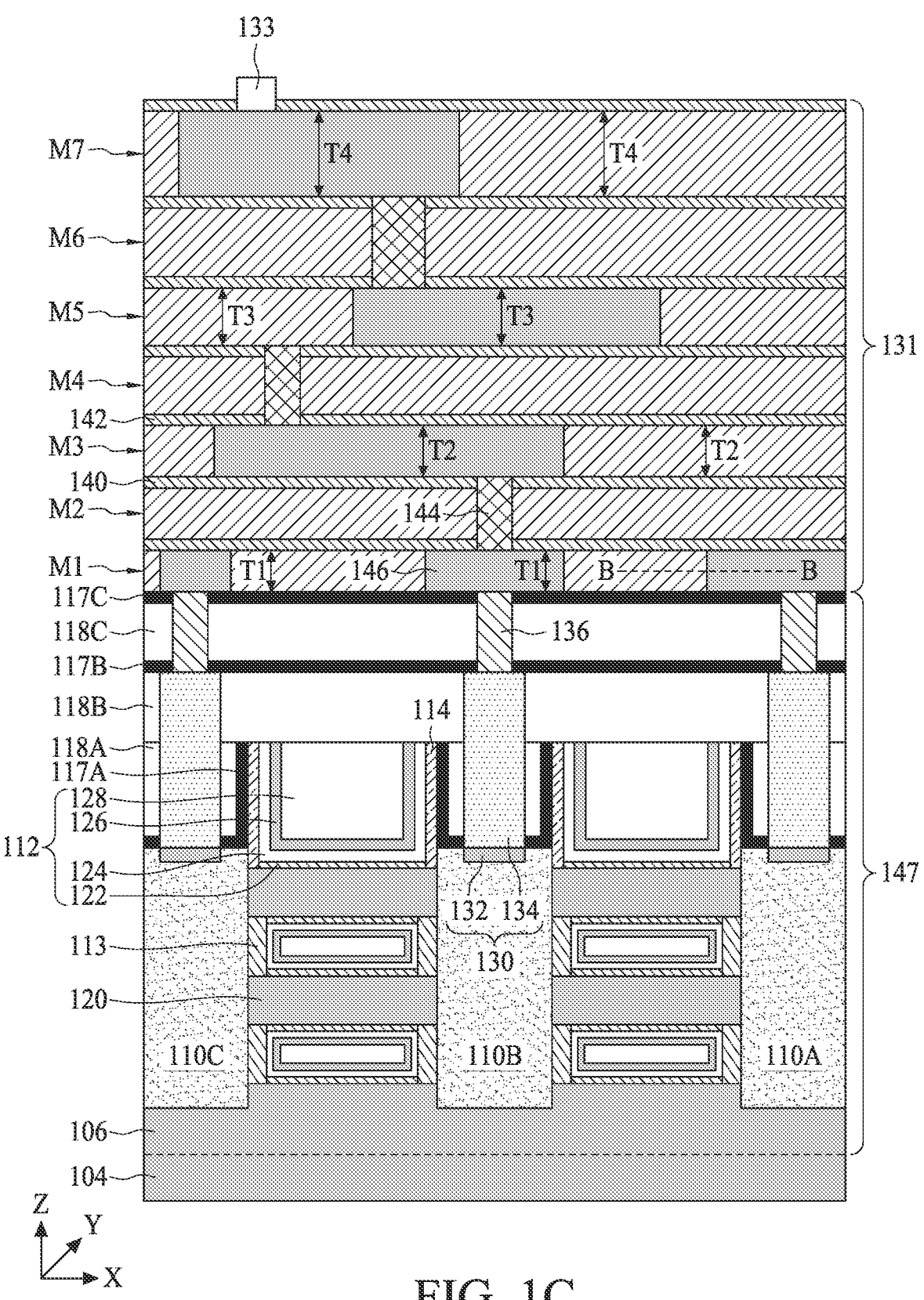
Figure 1D:
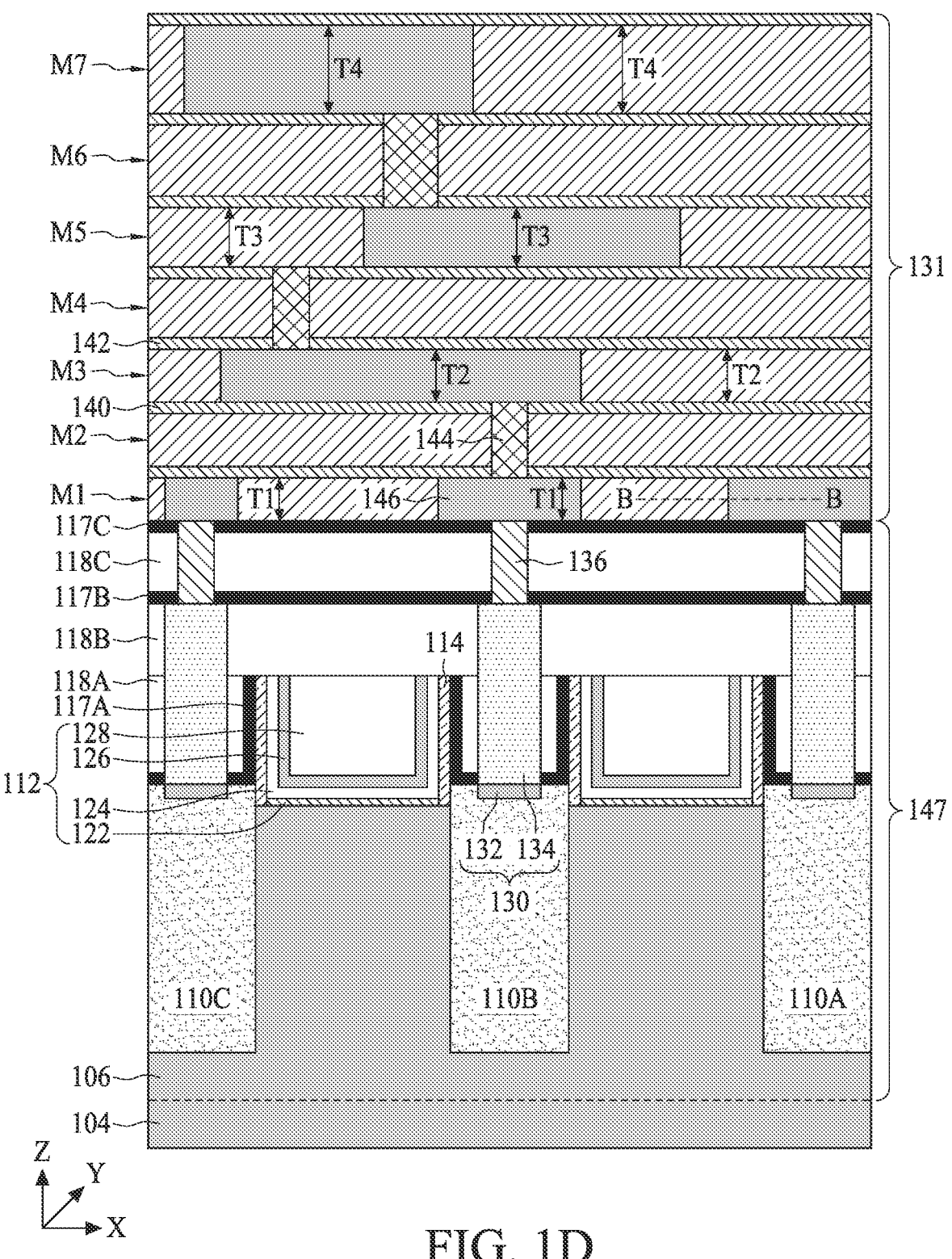

FIGS. 1B-1D are enlarged views of region 111A of FIG. 1A, according to some embodiments. FIG. 1B illustrates an isometric view of the structures in region 111A, according to some embodiments. FIGS. 1C and 1D illustrate different cross-sectional views along line A-A of FIG. 1B with additional structures that are not shown in FIG. 1A for simplicity, according to some embodiments.

FIG. 1B illustrates an isometric view of a portion of interconnect structure 131 disposed on a FET 147 of device layer 129 in region 111A of FIG. 1A, according to some embodiments. The elements of interconnect structure 131 are not shown in FIG. 1B for simplicity. In some embodiments, FET 147 can represent n-type FET 147 (NFET 147) or p-type FET 147 (PFET 147) and the discussion of FET 147 applies to both NFET 147 and PFET 147, unless mentioned otherwise. The discussion of elements in FIGS. 1A-1D with the same annotations applies to each other, unless mentioned otherwise.

Referring to FIG. 1B, in some embodiments, FET 147 can be formed on substrate 104 and can include an array of gate structures 112 disposed on a fin structure 106 and an array of S/D regions 110A-110C (S/D region 110A visible in FIG. 1B; 110A-110C visible in FIGS. 1C and 1D) disposed on portions of fin structure 106 that are not covered by gate structures 112. In some embodiments, fin structure 106 can include a material similar to substrate 104 and extend along an X-axis. In some embodiments, FET 147 can further include gate spacers 114, shallow trench isolation (STI) regions 116, etch stop layers (ESLs) 117A-117C, and ILD layers 118A-118C. In some embodiments, gate spacers 114, STI regions 116, ESLs 117A-117C, and ILD layers 118A-118C can include an insulating material, such as silicon oxide, silicon nitride (SiN), silicon carbon nitride (SiCN), silicon oxycarbon nitride (SiOCN), and silicon germanium oxide.

Referring to FIG. 1C, in some embodiments, FET 147 can be a GAA FET 147 and can include (i) S/D regions 110A-110C, (ii) contact structures 130 disposed on S/D regions 110A-110C, (iii) via structures 136 disposed on contact structures 130, (iv) nanostructured channel regions 120 disposed on fin structure 106, and (v) gate structures 112 surrounding nanostructured channel regions 120. As used herein, the term "nanostructured" defines a structure, layer, and/or region as having a horizontal dimension (e.g., along an X- and/or Y-axis) and/or a vertical dimension (e.g., along a Z-axis) less than about 100 nm, for example about 90 nm, about 50 nm, or about 10 nm; other values less than about 100 nm are within the scope of the disclosure. In some embodiments, FET 147 can be a finFET 147, as shown in FIG. 1D.

In some embodiments, nanostructured channel regions 120 can include semiconductor materials similar to or different from substrate 104. In some embodiments, nanostructured channel regions 120 can include Si, SiAs, silicon phosphide (SiP), SiC, SiCP, SiGe, silicon germanium boron (SiGeB), germanium boron (GeB), silicon germanium stannum boron (SiGeSnB), a III-V semiconductor compound, or other suitable semiconductor materials. Though rectangular cross-sections of nanostructured channel regions 120 are shown, nanostructured channel regions 120 can have cross-sections with other geometric shapes (e.g., circular, elliptical, triangular, or polygonal). Gate portions of gate structures 112 surrounding nanostructured channel regions 120 can be electrically isolated from adjacent S/D regions 110A-110C by inner spacers 113. Inner spacers 113 can include an insulating material, such as SiOx, SiN, SiCN, SiOCN, and other suitable insulating materials.

Each of gate structures 112 can include (i) an interfacial oxide (IO) layer 122, (ii) a high-k (HK) gate dielectric layer 124 disposed on IO layer 122, (iii) a work function metal (WFM) layer 126 disposed on HK gate dielectric layer 124, and (iv) a gate metal fill layer 128 disposed on WFM layer 126. As used herein, the term "high-k" refers to a high dielectric constant. In the field of semiconductor device structures and manufacturing processes, high-k refers to a dielectric constant that is greater than the dielectric constant of $SiO_2$ (e.g., greater than about 3.9). IO layers 122 can include silicon oxide ($SiO_2$), silicon germanium oxide (Si-$GeO_x$), germanium oxide ($GeO_x$), or other suitable oxide materials. HK gate dielectric layers 124 can include a high-k dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), zirconium silicate ($ZrSiO_2$), and other suitable high-k dielectric materials.

For NFET 147, WFM layer 126 can include titanium aluminum (TiAl), titanium aluminum carbide (TiAlC), tantalum aluminum (TaAl), tantalum aluminum carbide (TaAlC), Al-doped Ti, Al-doped TiN, Al-doped Ta, Al-doped TaN, other suitable Al-based conductive materials, or a combination thereof. For PFET 147, WFM layer 126 can include substantially Al-free (e.g., with no Al) Ti-based or Ta-based nitrides or alloys, such as titanium nitride (TiN), titanium silicon nitride (TiSiN), titanium gold (Ti—Au) alloy, titanium copper (Ti—Cu) alloy, tantalum nitride (TaN), tantalum silicon nitride (TaSiN), tantalum gold (Ta—Au) alloy, tantalum copper (Ta—Cu), other suitable substantially Al-free conductive materials, or a combination thereof. Gate metal fill layers 128 can include a conductive material, such as tungsten (W), Ti, silver (Ag), ruthenium (Ru), molybdenum (Mo), copper (Cu), cobalt (Co), Al, iridium (Ir), nickel (Ni), metal alloys, other suitable conductive materials, and a combination thereof.

For NFET 147, each of S/D regions 110A-110C can include an epitaxially-grown semiconductor material, such as Si, and n-type dopants, such as phosphorus and other suitable n-type dopants. For PFET 147, each of S/D regions 110A-110C can include an epitaxially-grown semiconductor material, such as Si and SiGe, and p-type dopants, such as boron and other suitable p-type dopants. In some embodiments, each of contact structures 130 can include (i) a silicide layer 132 disposed within each of S/D regions 110A-110C and (ii) a contact plug 134 disposed on silicide layer 132. In some embodiments, silicide layers 132 can include a metal silicide. In some embodiments, contact plugs 134 can include conductive materials with low resistivity (e.g., resistivity of about 50 μΩ-cm, about 40 μΩ-cm, about 30 μΩ-cm, about 20 μΩ-cm, or about 10 μΩ-cm), such as cobalt (Co), tungsten (W), ruthenium (Ru), iridium (Ir), nickel (Ni), Osmium (Os), rhodium (Rh), aluminum (Al), molybdenum (Mo), other suitable conductive materials with low resistivity, and a combination thereof. In some embodiments, via structures 136 can be disposed on contact structures 130 and can include conductive materials, such as Ru, Co, Ni, Al, Mo, W, Ir, Os, Cu, and Pt. Contact structures 130 can electrically connect to overlying interconnect structure 131 through via structures 136.

Interconnect structure 131 can be disposed on via structures 136 and ESL 117C. In some embodiments, interconnect structure 131 can include interconnect layers M1-M7. Though seven interconnect layers M1-M7 are discussed with reference to FIG. 1C, interconnect structure 131 can have any number of interconnect layers. Each of interconnect layers M1-M7 can include an ESL 140 and an ILD layer 142. ESLs 140 can include a dielectric material, such as aluminum oxide ($Al_xO_y$), nitrogen doped silicon carbide (SiCN), and oxygen doped silicon carbide (SiCO) with a dielectric constant ranging from about 4 to about 10.

In some embodiments, ILD layers 142 can include a low-k (LK) or extra low-k (ELK) dielectric material with a dielectric constant lower than that of silicon oxide (e.g., dielectric constant between about 2 and about 3.7). The LK or ELK dielectric material can reduce parasitic capacitances between interconnect layers M1-M7. In some embodiments, the LK or ELK dielectric material can include silicon oxycarbide (SiOC), nitrogen doped silicon carbide (SiCN), silicon oxycarbon nitride (SiCON), or oxygen doped silicon carbide. In some embodiments, ILD layers 142 can include one or more layers of insulating carbon material with a low dielectric constant of less than about 2 (e.g., ranging from about 1 to about 1.9). In some embodiments, the one or more layers of insulting carbon material can include one or more fluorinated graphene layers with a dielectric constant ranging from about 1 to about 1.5, or can include one or more graphene oxide layers.

In some embodiments, each of interconnect layers M1, M3, M5, and M7 can further include one or more interconnect lines 146 and/or each of interconnect layers M2, M4, and M6 can further include one or more conductive vias 144. The layout of interconnect lines 146 and conductive vias 144 is exemplary and not limiting and other layout variations of interconnect lines 146 and conductive vias 144 are within the scope of this disclosure. The number and arrangement of interconnect lines 146 and conductive vias 144 in each of interconnect layers M1-M7 can be different from the ones shown in FIG. 1C. The routings (also referred to as "electrical connections") between FET 147 and interconnect layers M1-M7 are exemplary and not limiting. There may be routings between FET 147 and interconnect layers M1-M7 that are not visible in the cross-sectional view of FIG. 1C.

Each of interconnect lines 146 can be disposed within ILD layer 142 and each of conductive vias 144 can be disposed within ILD layer 142 and a pair of ESLs 140 disposed on top and bottom surfaces of the corresponding ILD layer 142. Conductive vias 144 provide electrical connections between interconnect lines 146 of adjacent interconnect layers. In some embodiments, conductive vias 144 can include an electrically conductive material, such as Cu, Ru, Co, Mo, a Cu alloy (e.g., Cu—Ru, Cu—Al, or copper-manganese (CuMn)), carbon nanotubes, graphene layers, and any other suitable conductive material. In some embodiments, interconnect lines 146 can include electrically conductive material, such as Cu, Ru, Co, Mo, carbon nanotubes, graphene layers, and any other suitable conductive material. In some embodiments, interconnect lines 146 and conductive vias 144 can include a metal liner (not shown) on which the conductive material is disposed. The metal liner can include a metal, such as tantalum, cobalt, and other suitable metals, or metal nitrides, such as titanium nitride, tantalum nitride, and other suitable metal nitrides. Interconnect lines 146 and conductive vias 144 of one or more of interconnect layers M1-M7 can be single damascene structures or dual-damascene structures. In some embodiments, thicknesses T1-T4 of interconnect lines 146 can be substantially equal to or different from each other.

Figure 1E:
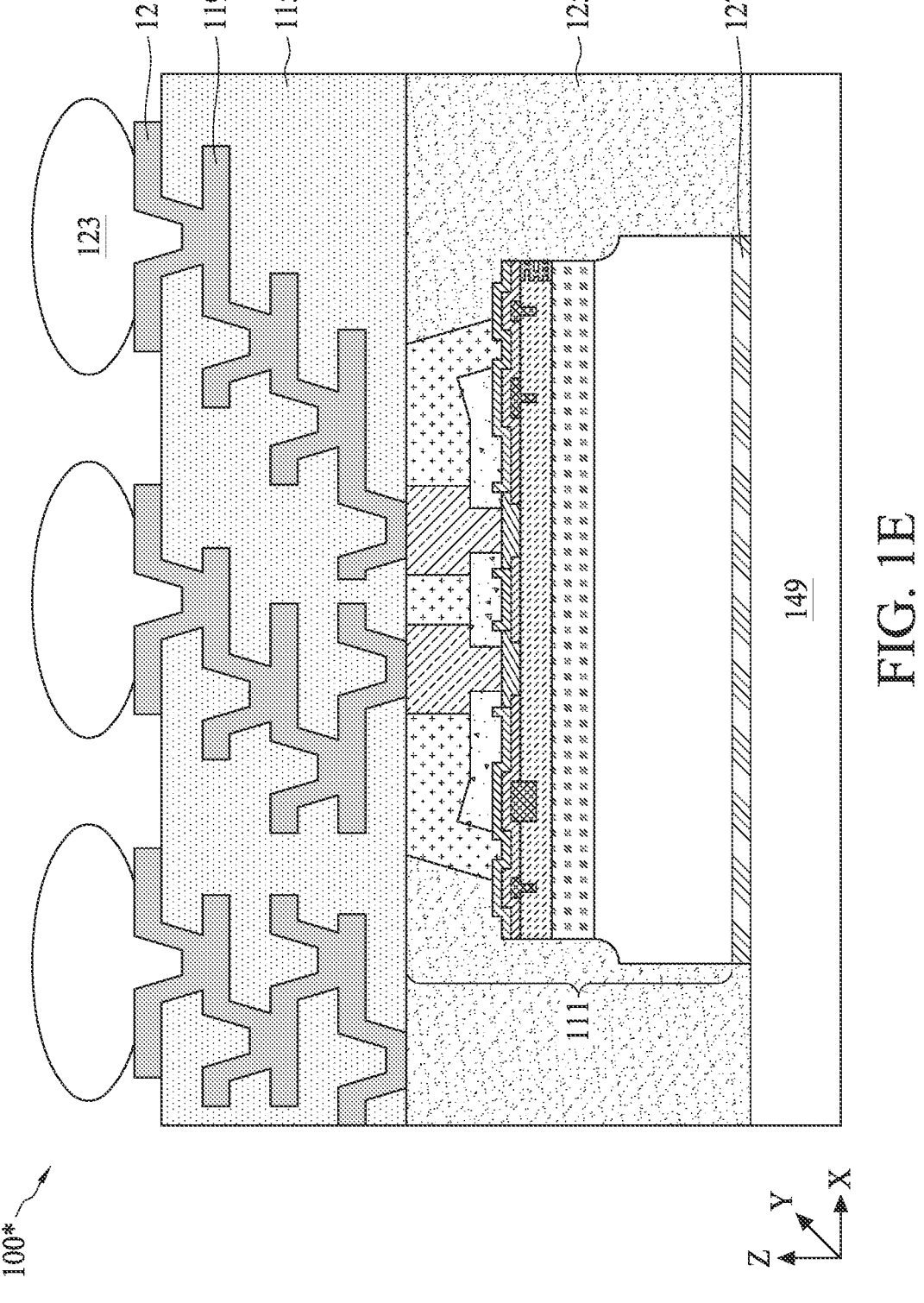
FIGS. 1E-1G illustrate cross-sectional views of IC chip packages, in accordance with some embodiments.

FIG. 1E illustrates a cross-sectional view of an IC chip package 100*, according to some embodiments. The discussion of elements in FIGS. 1A-1D with the same annotations applies to each other, unless mentioned otherwise. IC chip package 100* can have an InFO package structure, similar to IC chip package 100, but IC chip package 100* does not have a PoP structure. In some embodiments, IC chip 111 of IC chip package 100* can be disposed on a semiconductor substrate 149, instead of on another IC chip package.

Figure 1F:
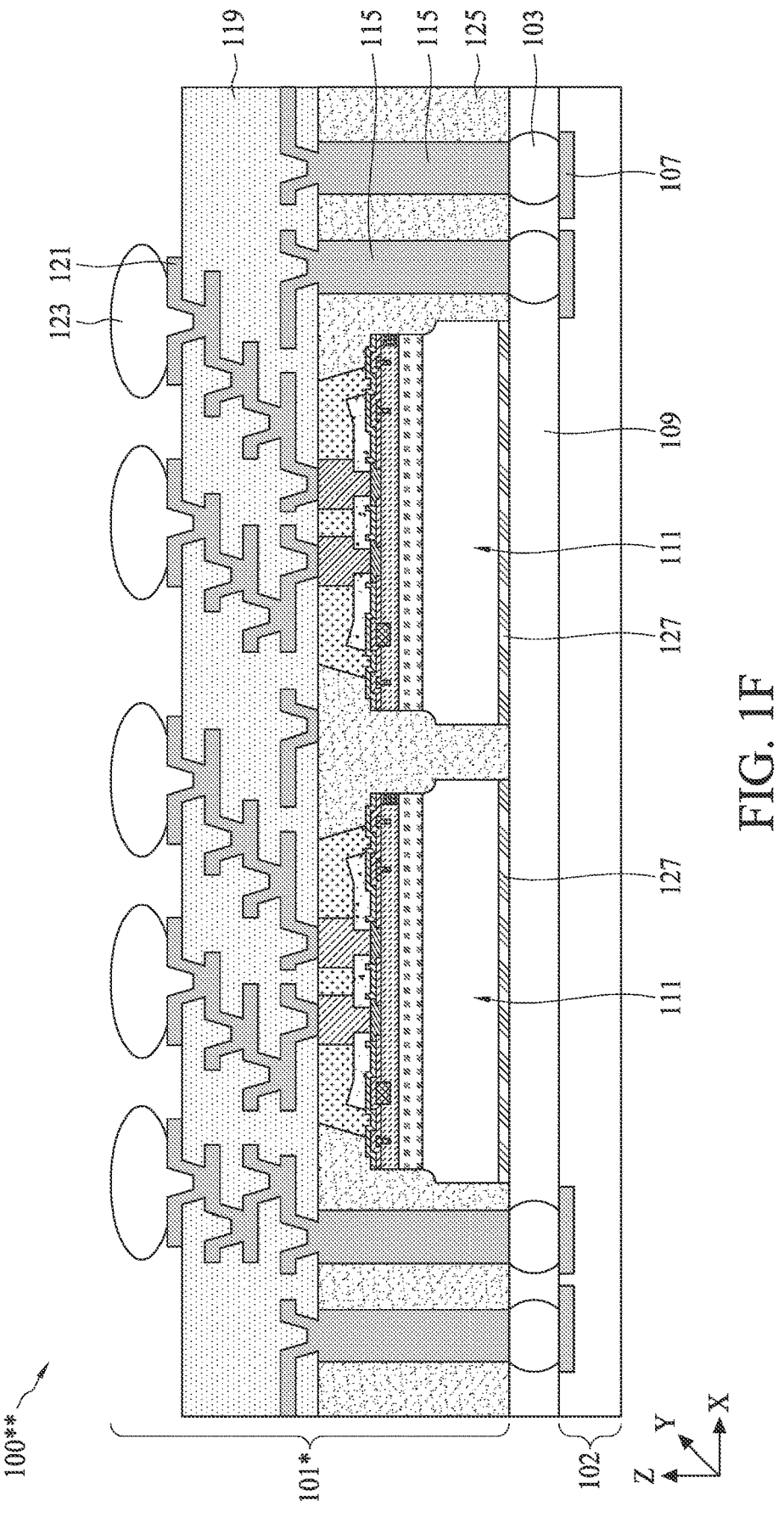

FIG. 1F illustrates a cross-sectional view of an IC chip package 100, according to some embodiments. The discussion of elements in FIGS. 1A-1D with the same annotations applies to each other, unless mentioned otherwise. IC chip package 100** can have an InFO PoP structure with a first IC chip package 101** stacked on second IC chip package 102. IC chip package 101* can be formed with multiple IC chips 111, instead of a single IC chip 111 as shown in IC chip package 101 of FIG. 1A**.

Figure 1G:
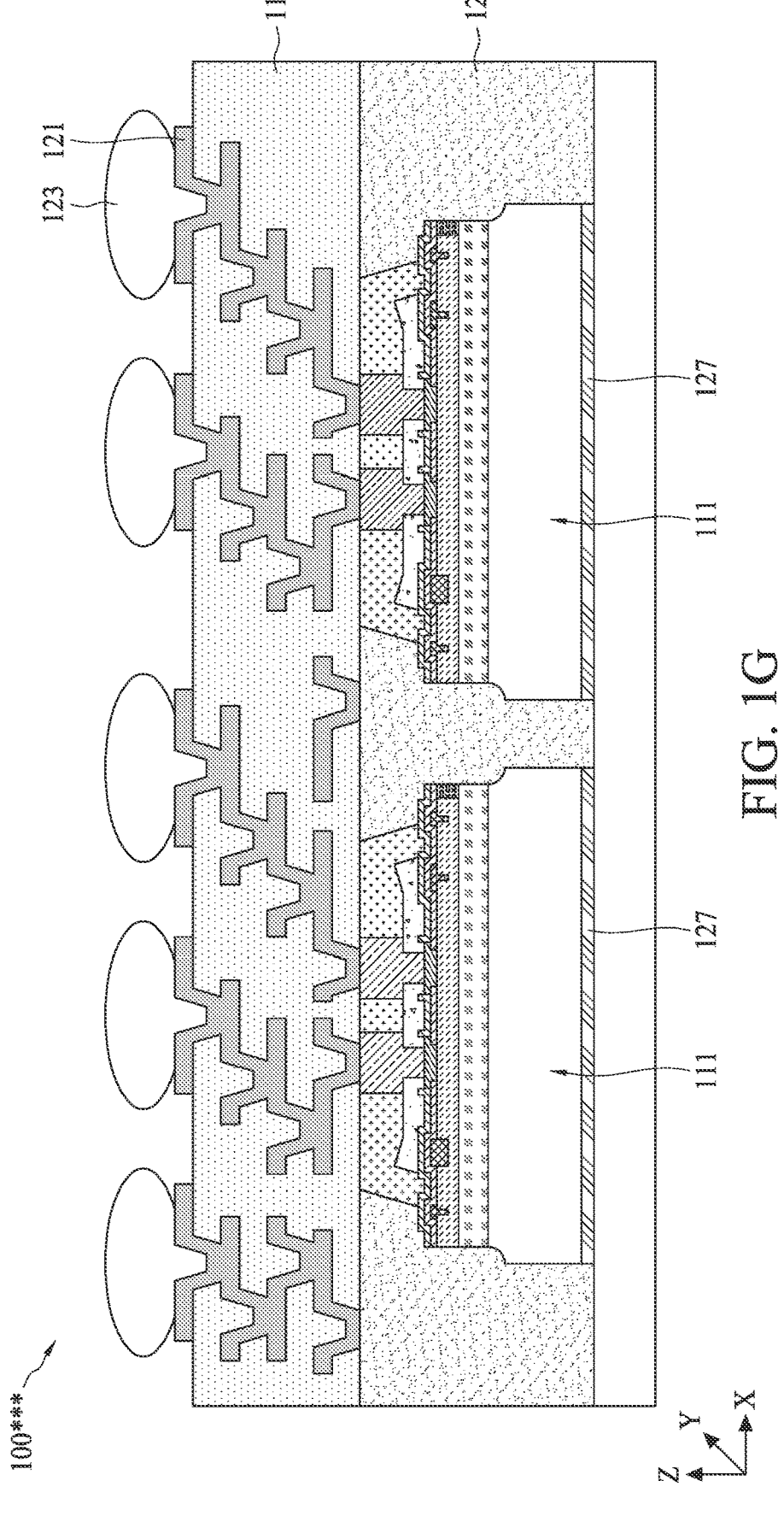

FIG. 1G illustrates a cross-sectional view of an IC chip package 100*, according to some embodiments. The discussion of elements in FIGS. 1A-1F with the same annotations applies to each other, unless mentioned otherwise. IC chip package 100*** can have an InFO package structure, similar to IC chip package 100**, but IC chip package 100*** does not have a PoP structure. In some embodiments, IC chips 111 of IC chip package 100*** can be disposed on semiconductor substrate 149**, instead of on another IC chip package.

FIG. 2 is a flow diagram of an example method 200 for IC chip package 100, according to some embodiments. For illustrative purposes, the operations illustrated in FIG. 2 will be described with reference to the example fabrication process for fabricating IC chip package 100 as illustrated in FIGS. 3-21. FIGS. 3-21 are cross-sectional views of IC chip package 100 at various stages of fabrication, according to some embodiments. Operations can be performed in a different order or not performed depending on specific applications. It should be noted that method 200 may not produce a complete IC chip package 100. Accordingly, it is understood that additional processes can be provided before, during, and after method 200, and that some other processes may only be briefly described herein. Elements in FIGS. 3-21 with the same annotations as elements in FIGS. 1A-1G are described above.

Figure 3:
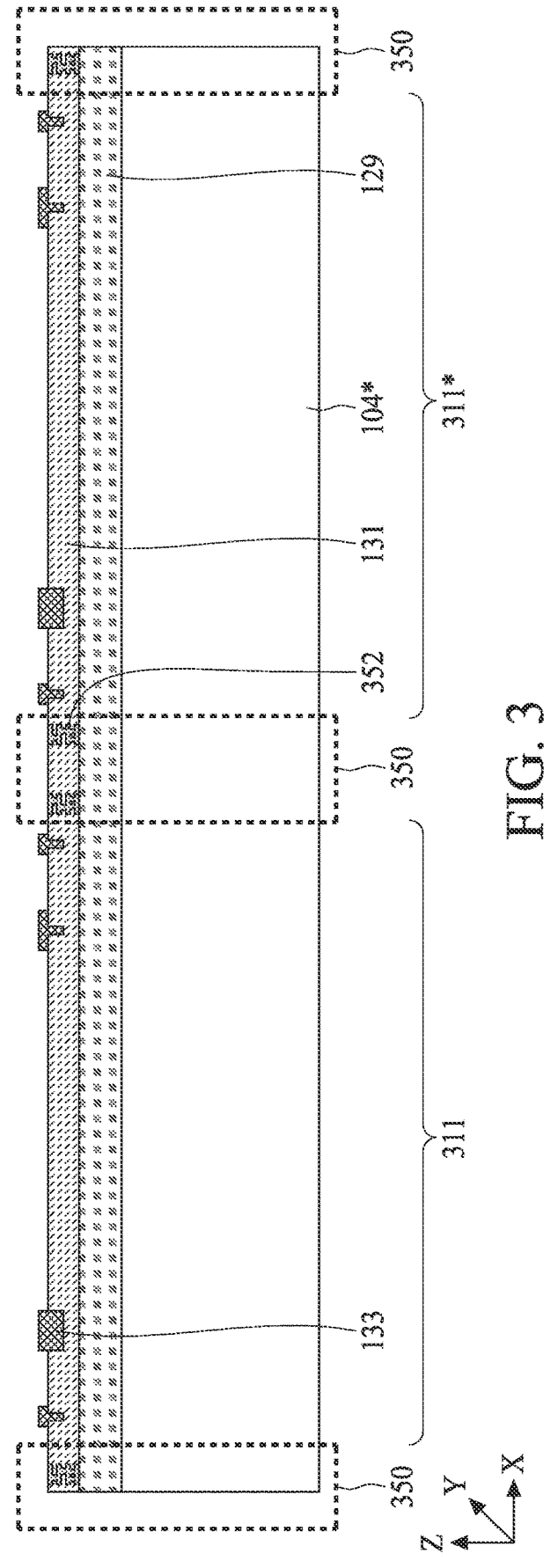

Referring to FIG. 2, in operation 205, a device layer is formed on a wafer and an interconnect structure is formed on the device layer. For example, as shown in FIG. 3, device layer 129 is formed on wafer 104* and interconnect structure 131 is formed on device layer 129. In some embodiments, semiconductor devices, such as GAA FETs, finFETs, and MOSFETs can be formed in device layer 129. The formation of interconnect structure 131 can followed by the formation of aluminum pads 133, as shown in FIG. 3. The dashed boxes indicate scribe lane areas 350 (also referred to as "scribe line areas 350") between dies (e.g., dies 311 and 311*) of wafer 104*. Though FIG. 3 shows two dies 311 and 311*, wafer 104* can have any number of dies. In some embodiments, dummy metal lines 352 can be formed in scribe lane areas 350, as shown in FIG. 3, during the formation of interconnect structure 131.

Figure 4:
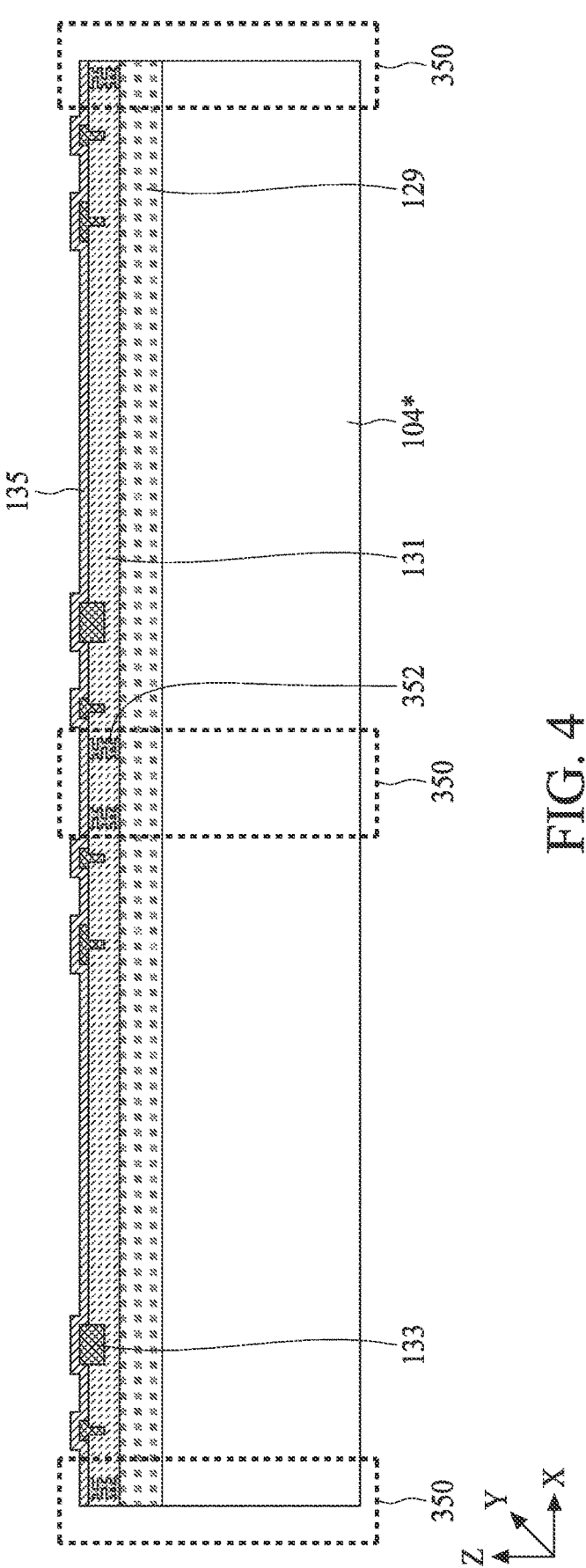
Figure 5:
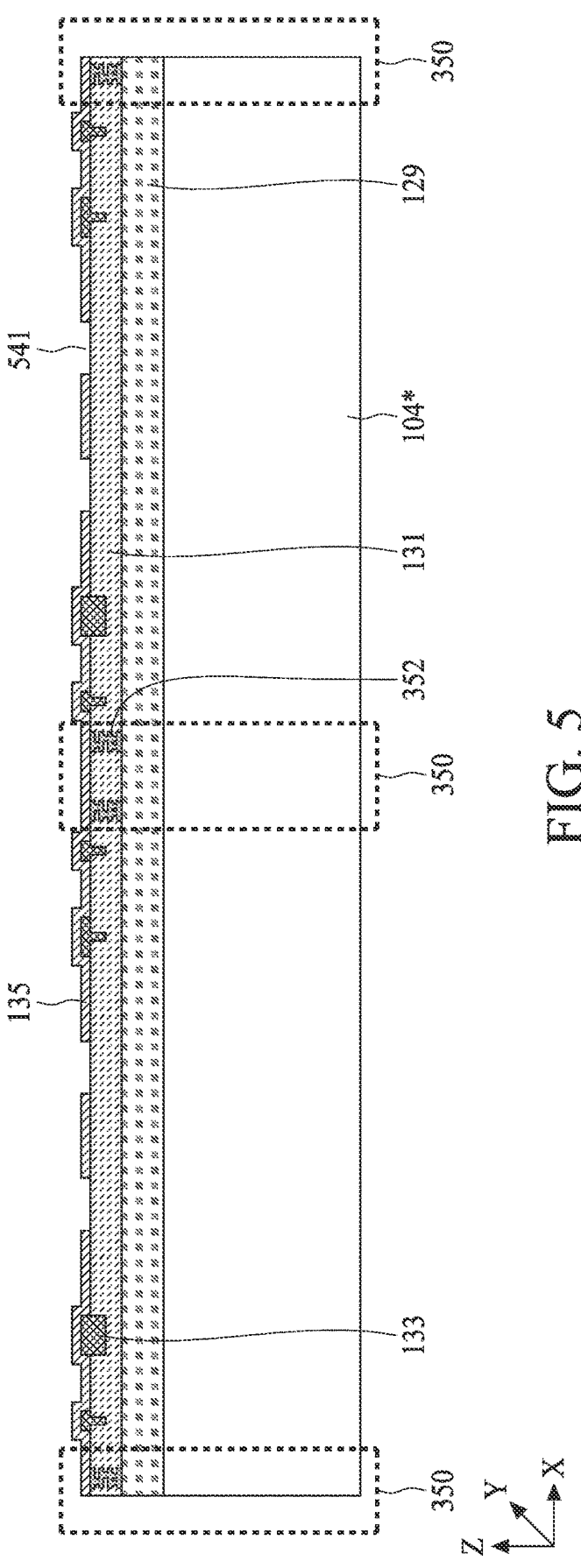
Figure 6:
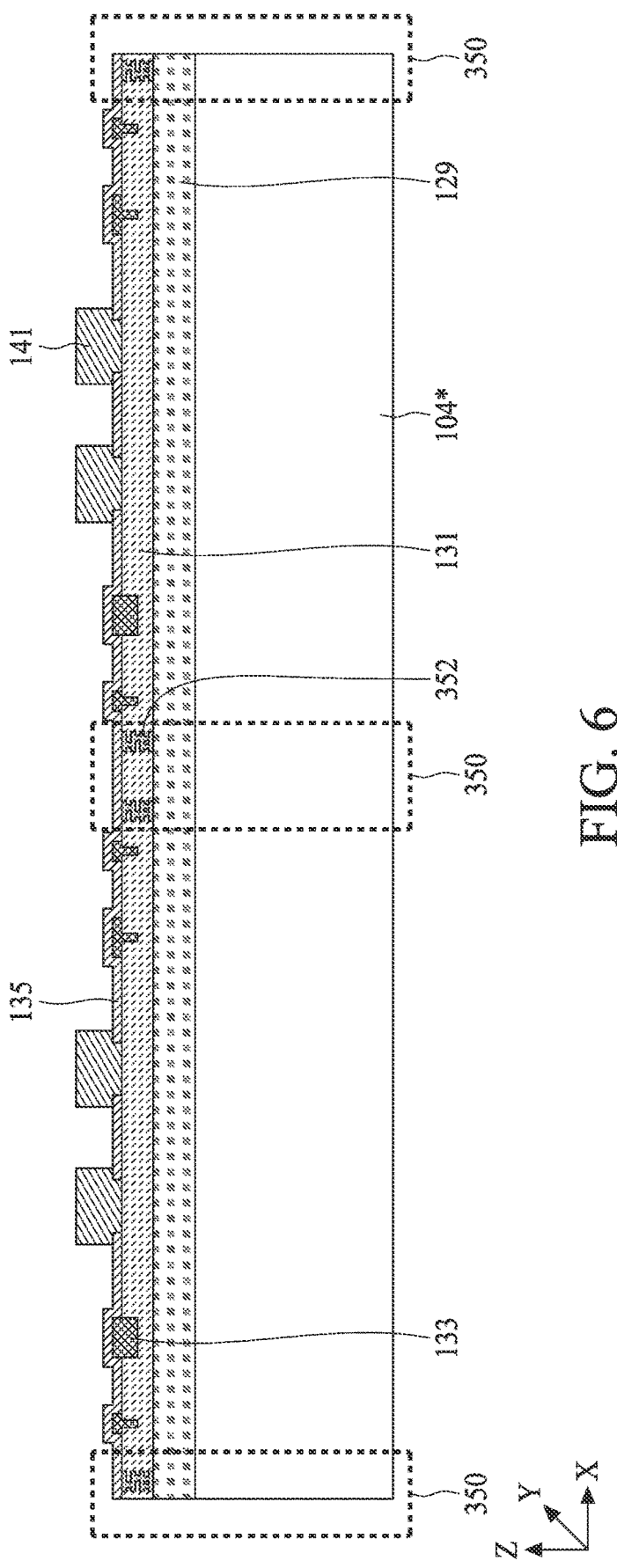

Referring to FIG. 2, in operation 210, an oxide layer is deposited on the interconnect structure. For example, as shown in FIG. 4, oxide layer 135 is deposited on interconnect structure 131. In some embodiments, the deposition of oxide layer 135 can include depositing a layer of silicon oxide or another suitable insulating oxide material on the structure of FIG. 3 to form the structure of FIG. 4.

Referring to FIG. 2, in operation 215, conductive landing pads are formed on the interconnect structure. For example, as described with reference to FIGS. 5-6, conductive landing pads 141 are formed on interconnect structure 131. The formation of conductive landing pads 141 can include sequential operations of: (i) forming openings 541 in oxide layer 135 to expose top surfaces of interconnect structure by selectively removing portions of oxide layer 135 with a lithographic process and an etching process, (ii) depositing a metal layer (not shown) on the structure of FIG. 5, and (iii) selectively removing portions of the metal layer with a lithographic process and an etching process to form the structure of FIG. 6.

Figure 7:
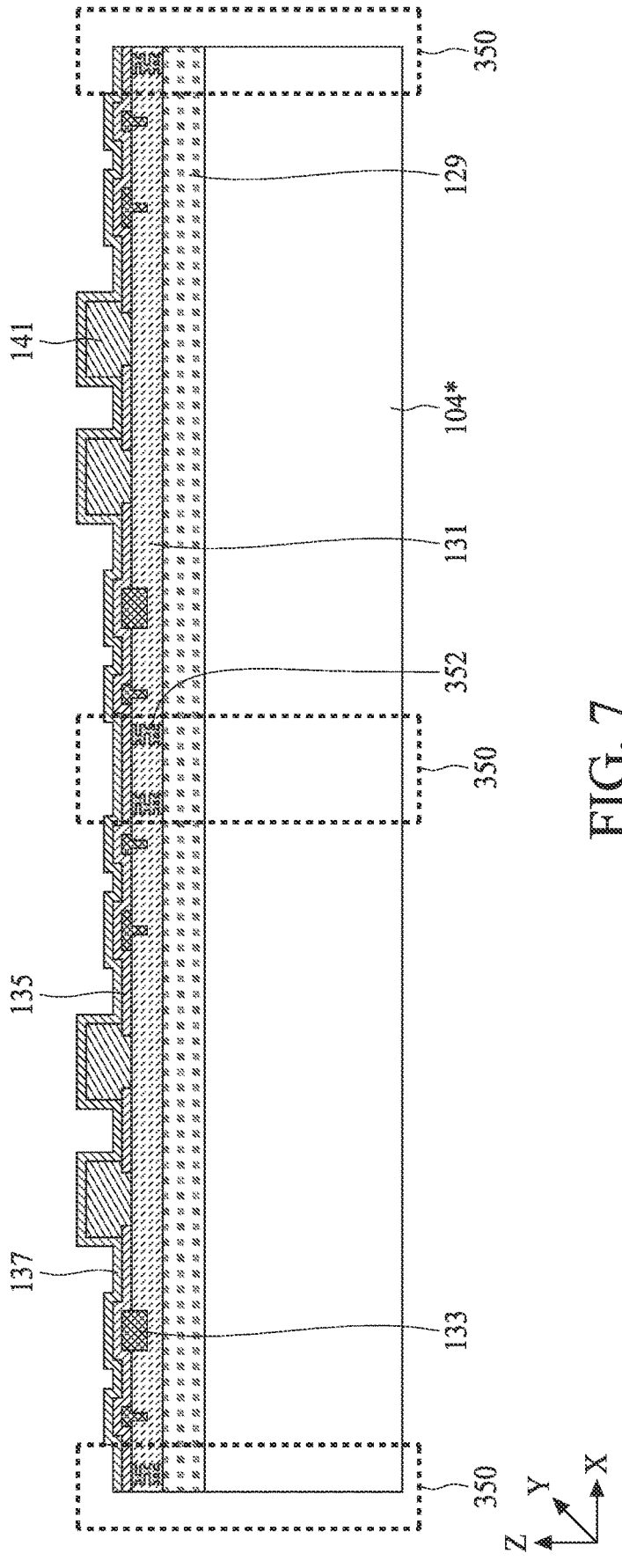
Figure 8:
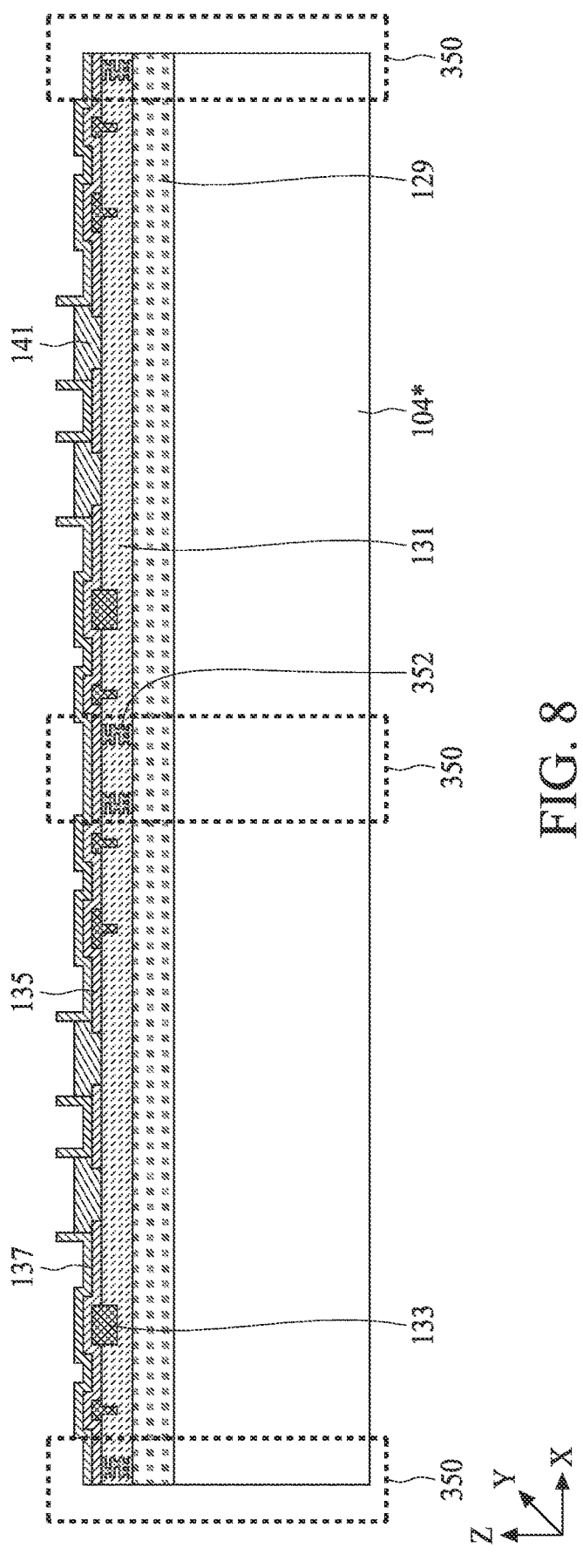
Figure 9:
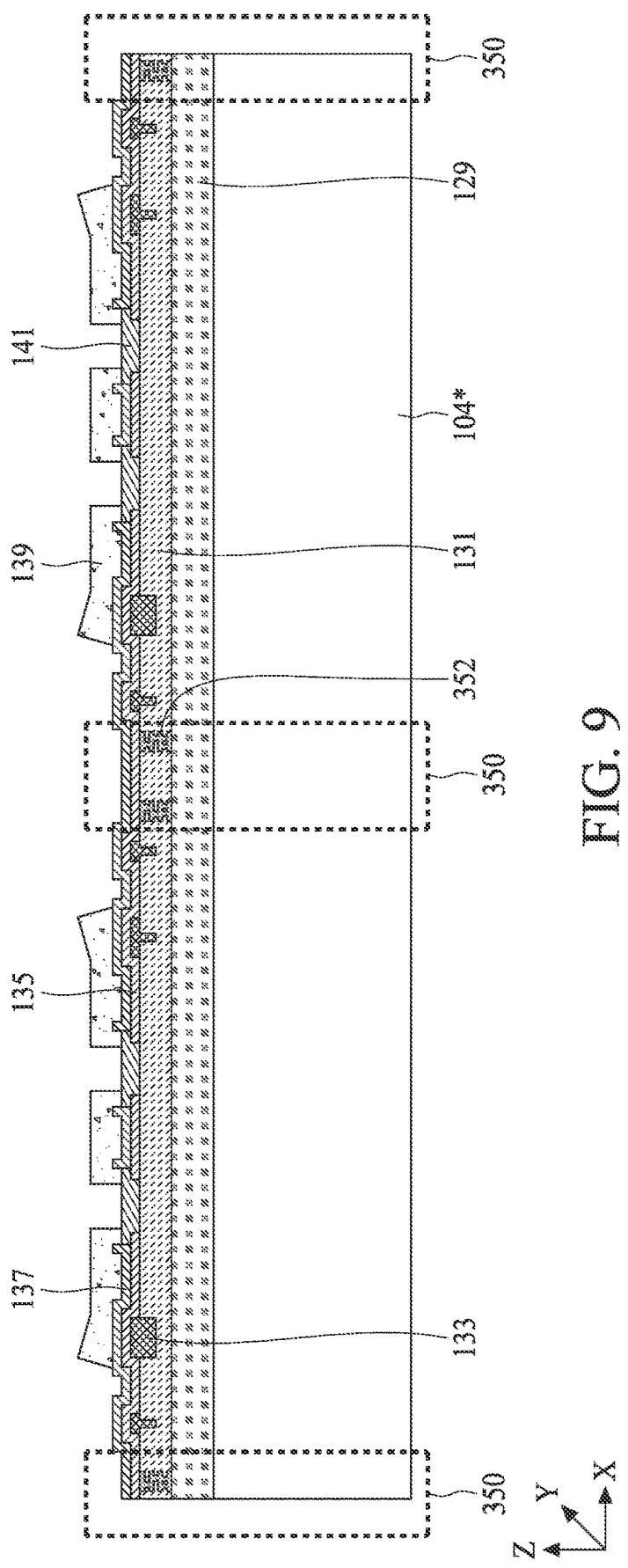
Figure 10:
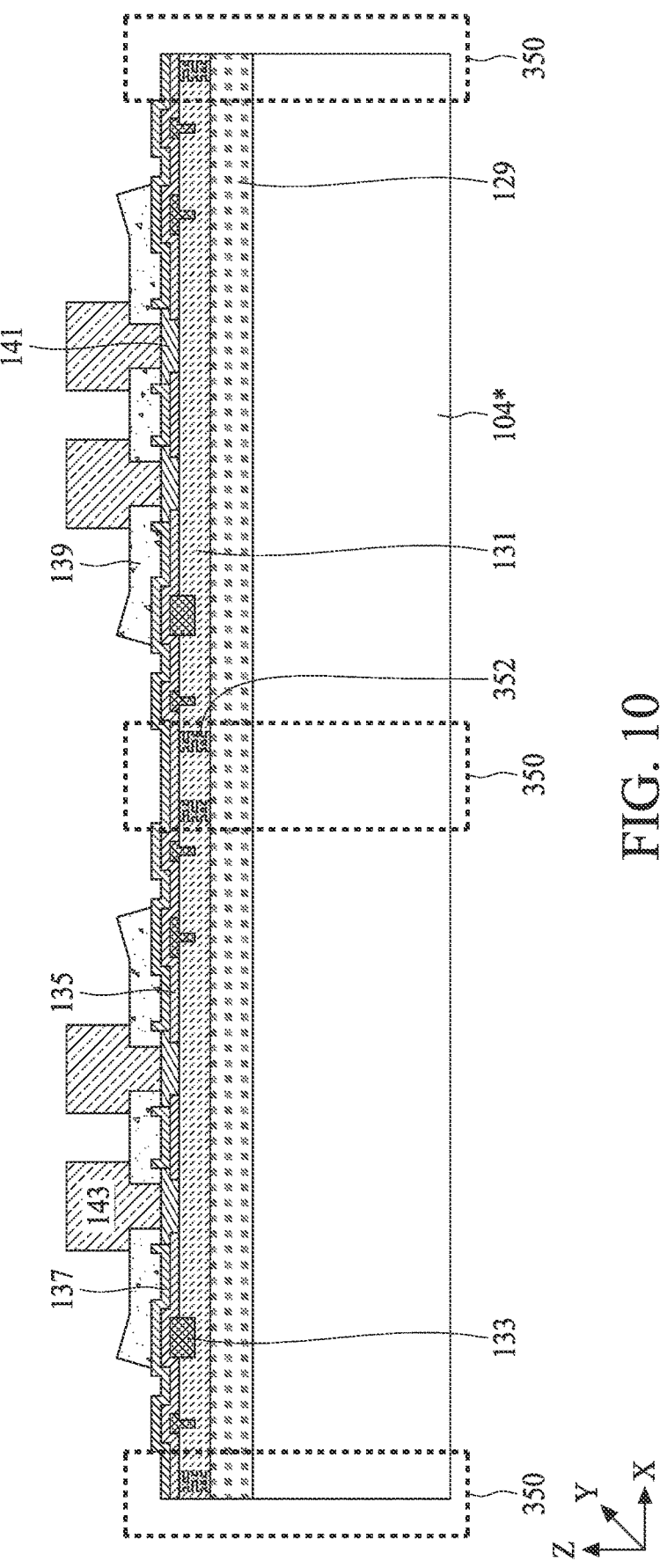

Referring to FIG. 2, in operation 220, a nitride layer is deposited on the interconnect structure and the conductive landing pads. For example, as shown in FIG. 7, nitride layer 137 is deposited on interconnect structure 131 and conductive landing pads 141. In some embodiments, the deposition of nitride layer 137 can include depositing a layer of silicon nitride or another suitable insulating nitride material on the structure of FIG. 6 to form the structure of FIG. 7.

Referring to FIG. 2, in operation 225, conductive vias are formed on the conductive landing pads. For example, as described with reference to FIGS. 8-10, conductive vias 143 are formed on conductive landing pads 141. The formation of conductive vias 143 can include sequential operations of: (i) etching portions of nitride layer 137 to expose top surfaces of conductive landing pads 141, (ii) etching conductive landing pads 141 to form the structure of FIG. 8, (iii) forming polymer layer 139 on the structure of FIG. 8 to form the structure of FIG. 9, (iv) depositing a metal layer (not shown) on the structure of FIG. 9, and (v) selectively removing portions of the metal layer with a lithographic process and an etching process to form the structure of FIG. 10.

Referring to FIG. 2, in operation 230, a three-stage die-singulation process is performed to form first and second IC chips from each other. For example, as described with reference to FIGS. 11-14, a three-stage die-singulation process is performed to form first IC chip 111 and a second IC chip 111*.

Figure 11:
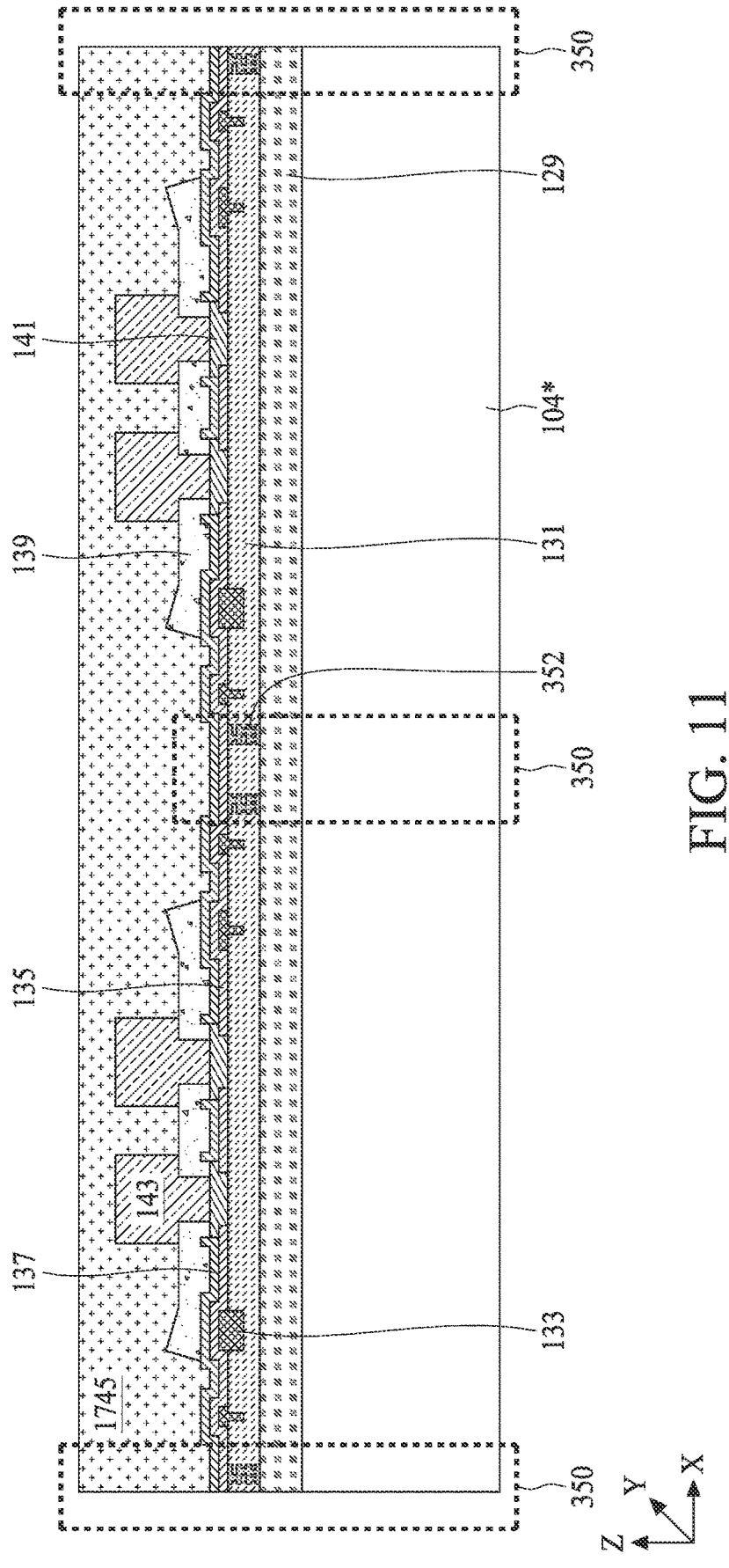
Figure 12:
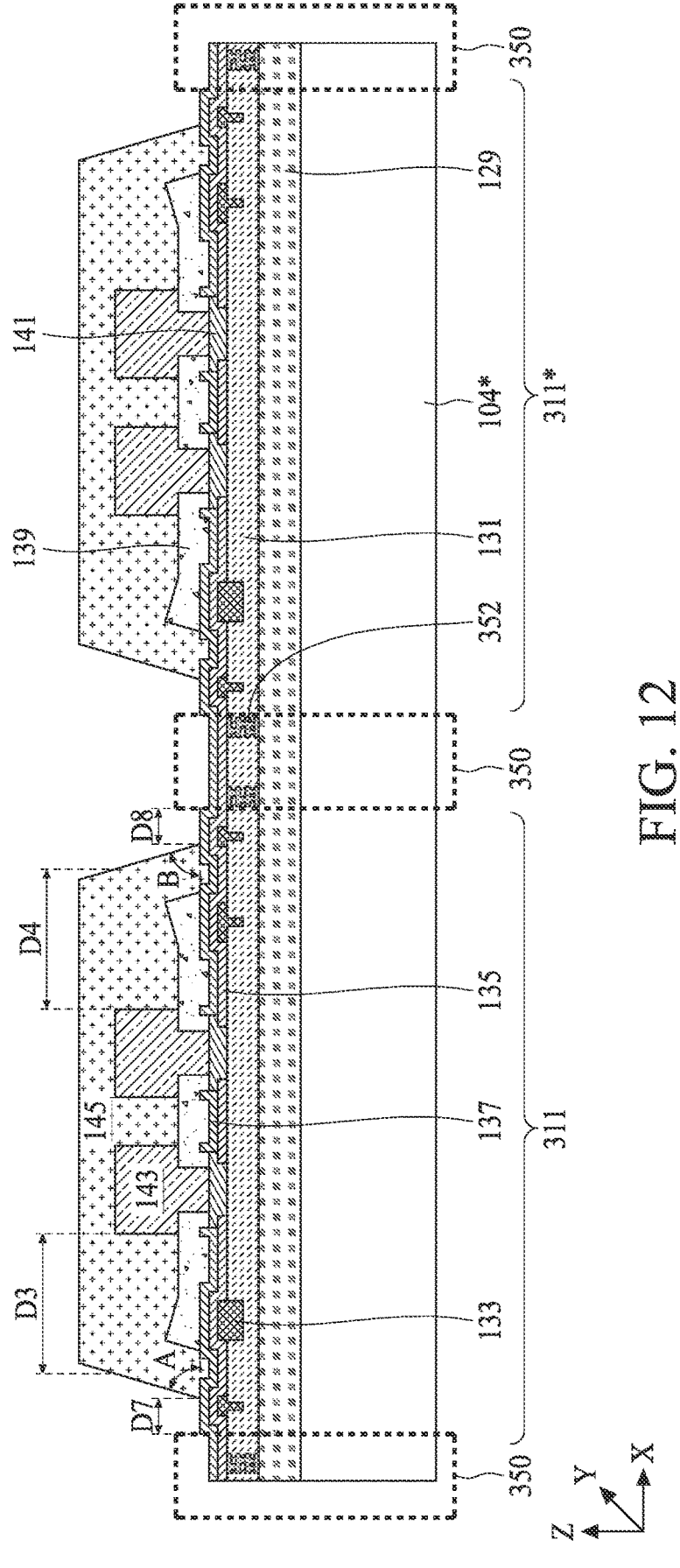

In some embodiments, the first stage of die-singulation process can include forming stress buffer layers 145 on each of dies 311 and 311*, as shown in FIG. 12. The formation of stress buffer layers 145 can include sequential operations of: (i) depositing a photosensitive material layer 1745 on the structure of FIG. 10, as shown in FIG. 11, (ii) patterning photosensitive material layer 1745 with a photolithographic process to form the tapered structure of stress buffer layers 145, as shown in FIG. 12, and (iii) performing a curing process on stress buffer layers 145 of FIG. 12. In some embodiments, photosensitive material layer 1745 can include a polymer material and the curing process can toughen or harden the polymer material by cross-linking polymer chains of the polymer material. In some embodiments, the curing process can be performed at a temperature of about 250° C. to about 400° C. for a duration of about 1 hour to about 4 hours.

In some embodiments, patterning photosensitive material layer 1745 can include forming stress buffer layers 145 with tapered sidewalls that can form angles A and B with top surface of nitride layer 137, as shown in FIG. 12. In some embodiments, angles A and B can be equal to or different from each other. In some embodiments, angles A and B can be greater than about 50 degrees and less than about 90 degrees. In some embodiments, patterning photosensitive material layer 1745 can include forming stress buffer layers 145 with bottom edges that are distances D7 and D8 away from die edge or scribe lane areas 350, as shown in FIG. 12. In some embodiments, distances D7 and D8 can be similar to or different from each other and can be greater than about 1 μm and less than about 30 μm. These dimension ranges provide stress buffer layers 145 with a structure to adequately buffer and/or substantially uniformly distribute the stress induced on the underlying structures during the second and third stages of the die-singulation process and consequently prevent or reduce the risk of delamination of underlying layers. In some embodiments, distances D7 and D8 protect stress buffer layers 145 from being exposed to a laser used during the second stage of the die-singulation process. The first stage of die-singulation process can be followed by a wafer thinning process.

Figure 13:
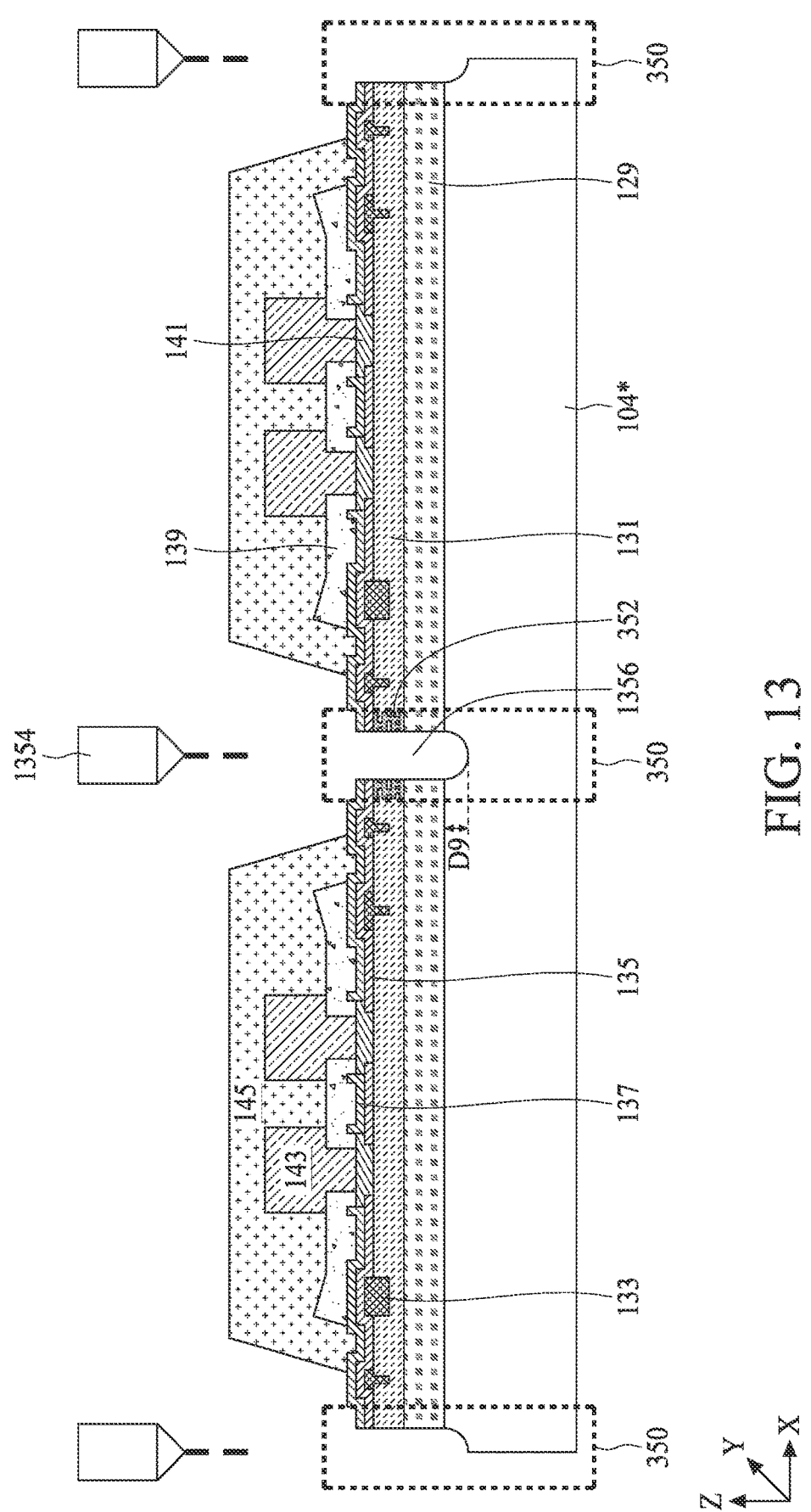

In some embodiments, the second stage of die-singulation process can include forming trenches 1356 along scribe lanes in scribe lane areas 350, as shown in FIG. 13. The formation of trenches 1356 can include removing portions of nitride layer 137, oxide layer 135, interconnect structure 131, device layer 129, and wafer 104\* in scribe lane areas 350 with a laser grooving process. In some embodiments, trenches 1356 extend a distance D9 of about 1 μm to about 5 μm into wafer 104\* to reduce or prevent stress induced on nitride layer 137, oxide layer 135, interconnect structure 131, and device layer 129 during a wafer saw process used in the third stage of the die-singulation process.

In some embodiments, the laser grooving process can include using a laser 1354 with a power density of about 0.4 J/mm$^2$ to about 1.2 J/mm$^2$ and a wavelength of about 300 nm to about 500 nm. This laser power density is about 30% to about 50% lower than that used in a laser grooving process of a two-stage die-singulation process. In the two-stage die-singulation process, stress buffer layers are not removed from scribe lane areas with a lithographic process prior to using the laser grooving process. Instead, the stress buffer layers along with the oxide layer, nitride layer, interconnect structure, device layer, and wafer are removed from scribe lane areas to form trenches using a laser grooving process. As a result, a higher laser power density is required in the laser grooving process of a two-stage die-singulation process. With the use of a lower laser power density during the second stage of die-singulation process, thermal damages, such as delamination of nitride layer 137, oxide layer 135, ILD layers 142 of interconnect structure 131, and formation of voids in interconnect lines 146 of interconnect structure 131 and conductive vias 143 can be substantially reduced or eliminated.

Figure 14:
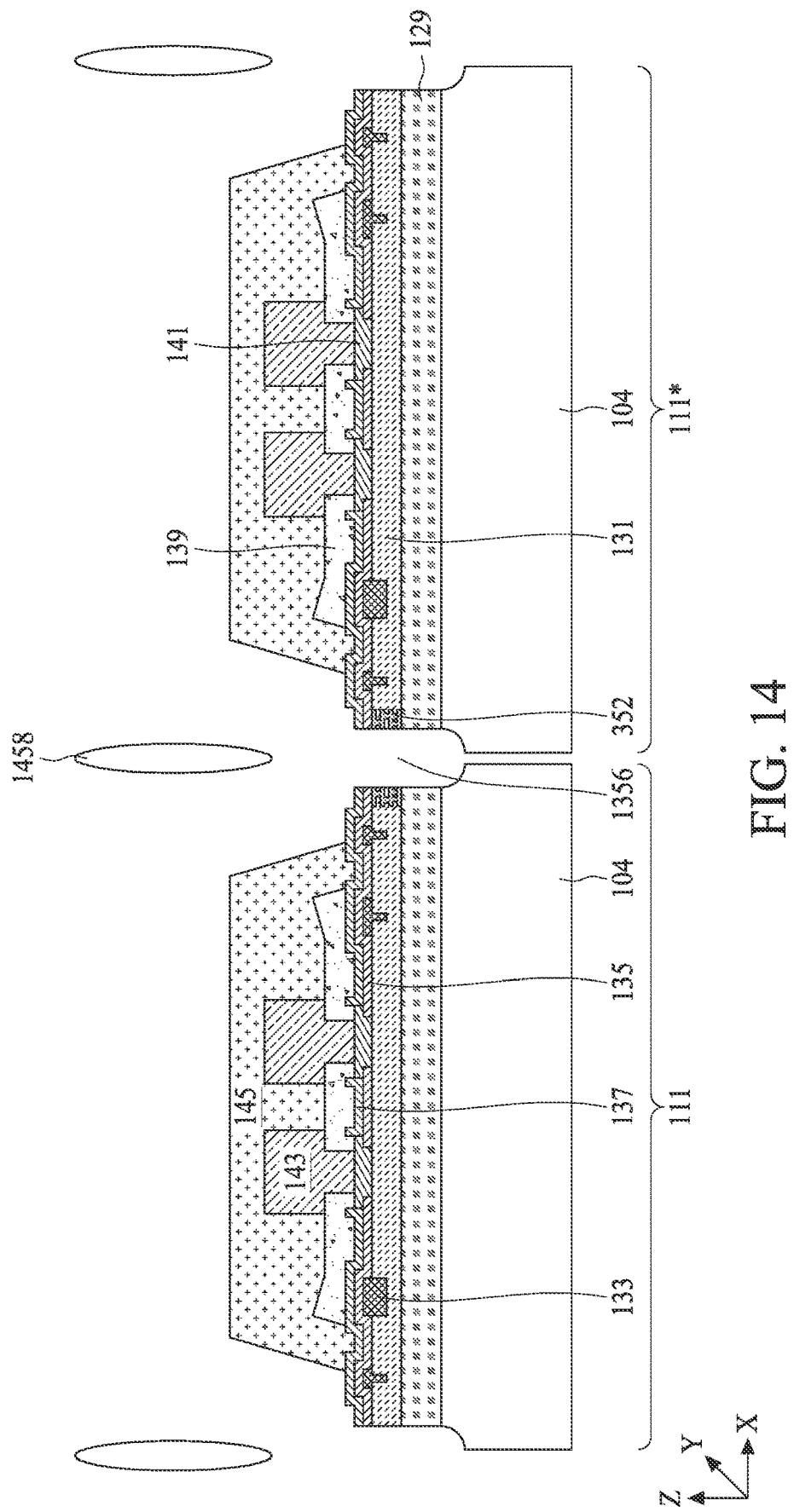

In some embodiments, the third stage of die-singulation process can include separating dies 311 and 311\* from each other to form IC chips 111 and 111\*, as shown in FIG. 14. In some embodiments, the separation of dies 311 and 311\* can include sawing wafer 104\* through trenches 1356 using a mechanical saw 1458.

Referring to FIG. 2, in operation 235, conductive through-vias are formed on a carrier substrate. For example, as described with reference to FIGS. 15-16, conductive through-vias 105 are formed on a carrier substrate 1560. The formation of conductive through-vias 105 can include sequential operations of: (i) depositing a de-bond layer 1562 on carrier substrate 1560, as shown in FIG. 15, (ii) forming a patterned photoresist layer 1566 with openings (not shown), (iii) depositing a metal layer of conductive through-vias 105 in the openings to form the structure of FIG. 15, and (iv) removing patterned photoresist layer 1566 to form the structure of FIG. 16.

Figure 17:
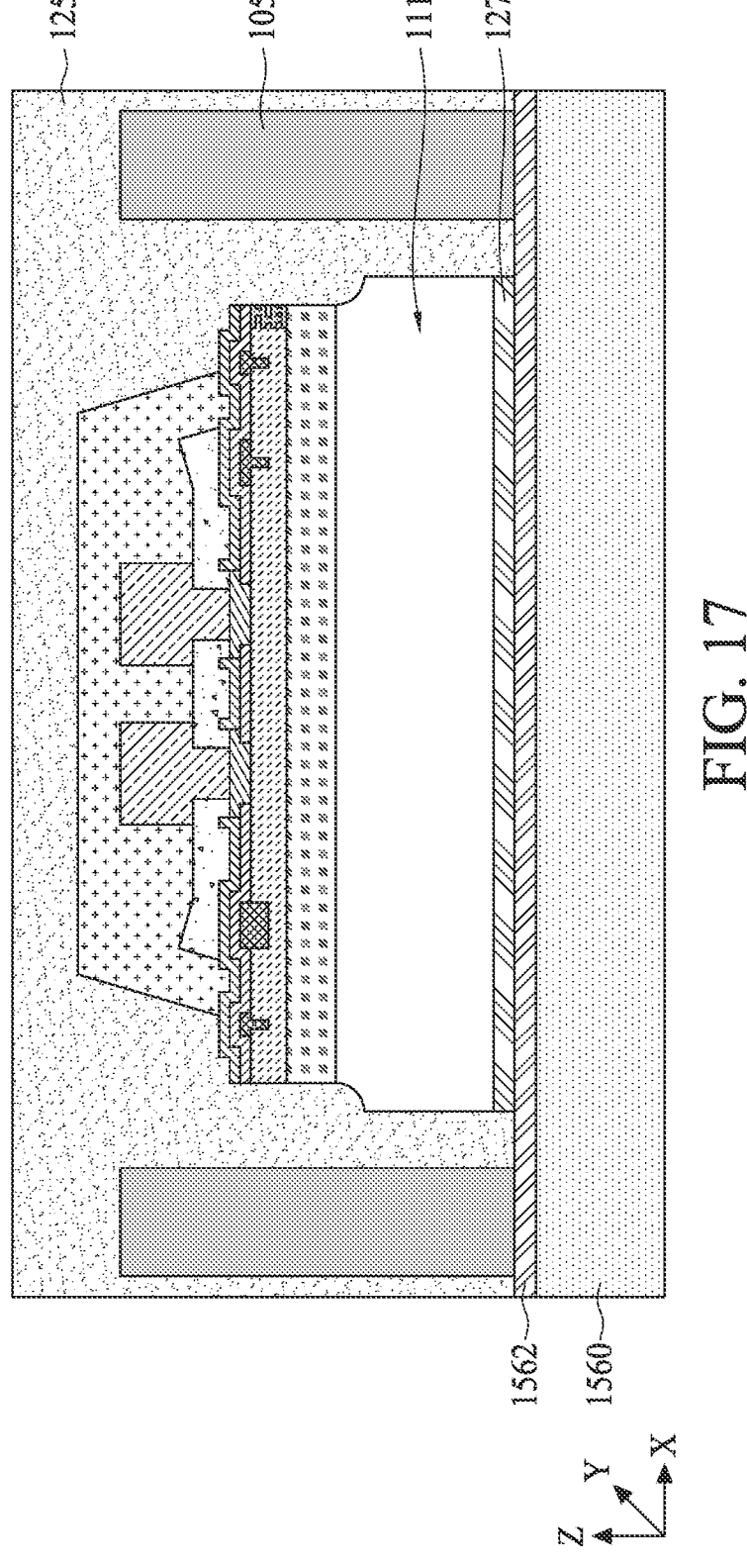
Figure 18:
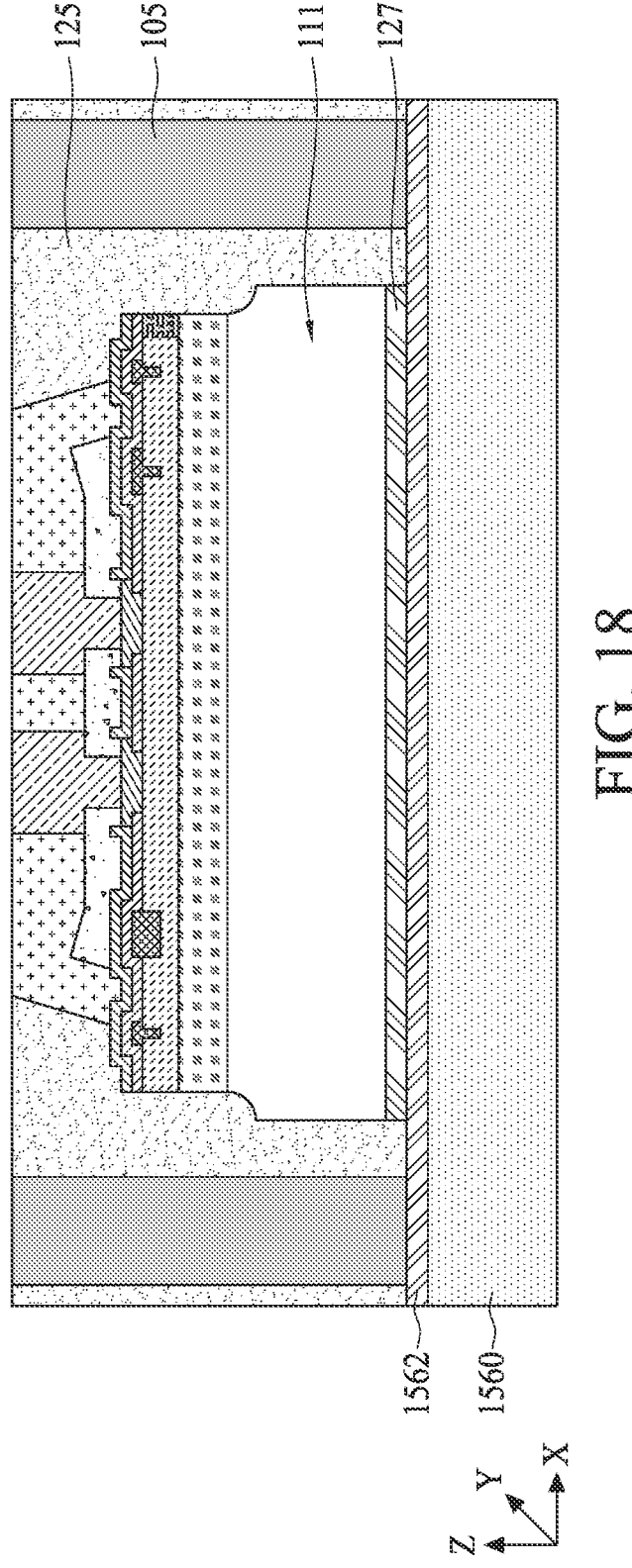

Referring to FIG. 2, in operation 240, the first IC chip is bonded to the carrier substrate. For example, as shown in FIG. 17, first IC chip 111 is bonded to carrier substrate 1560 with a die attach film 127. The bonding of first IC chip 111 can be followed by depositing molding layer 125 to encapsulate first IC chip 111 and conductive through-vias 105 to form the structure of FIG. 17. The deposition of molding layer 125 can be followed by a grinding process or a chemical mechanical polishing (CMP) process to substantially planarize top surfaces of stress buffer layer 145 and molding layer 125 and expose top surfaces of conductive vias 143, as shown in FIG. 18.

Figure 19:
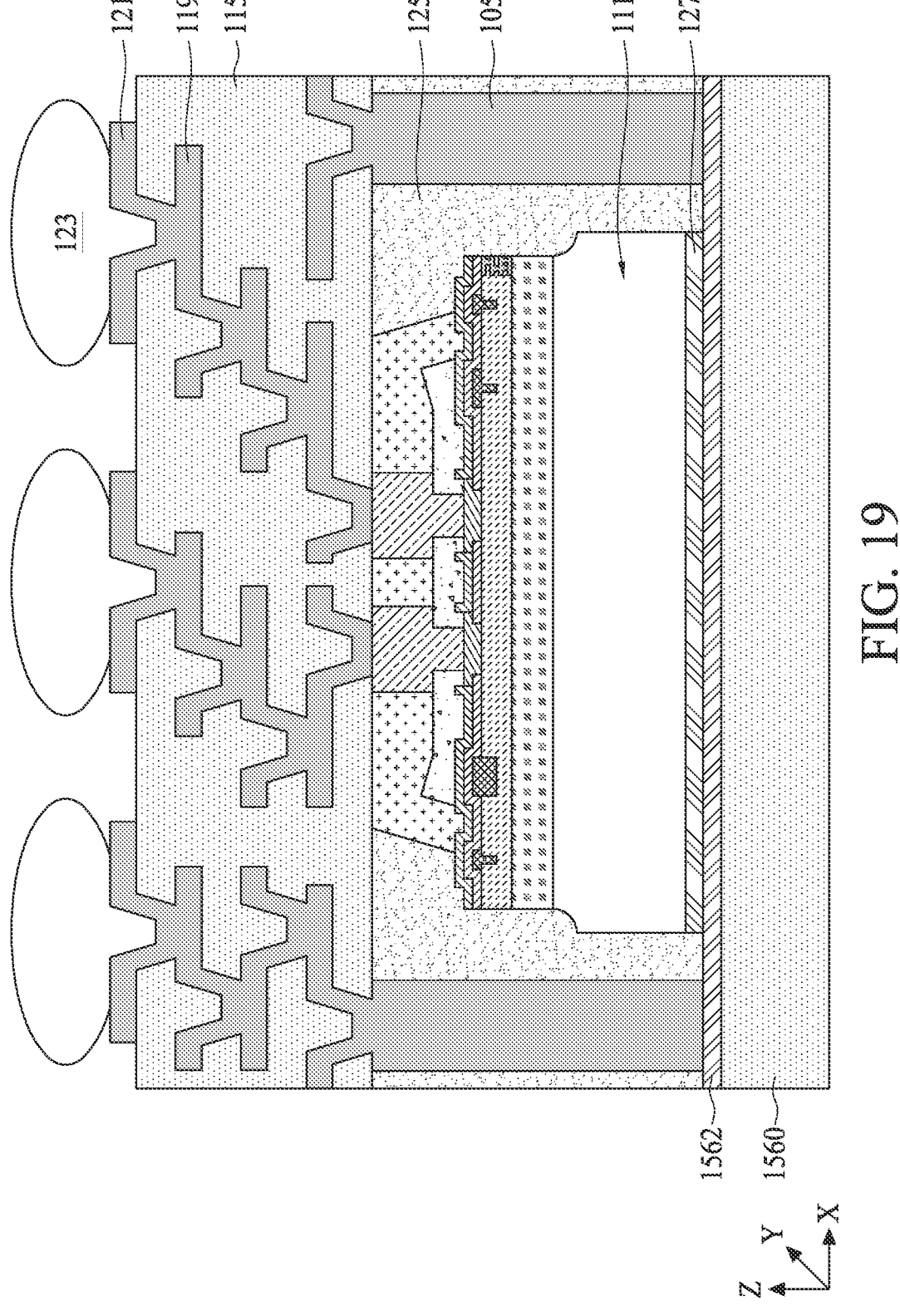
Figure 20:
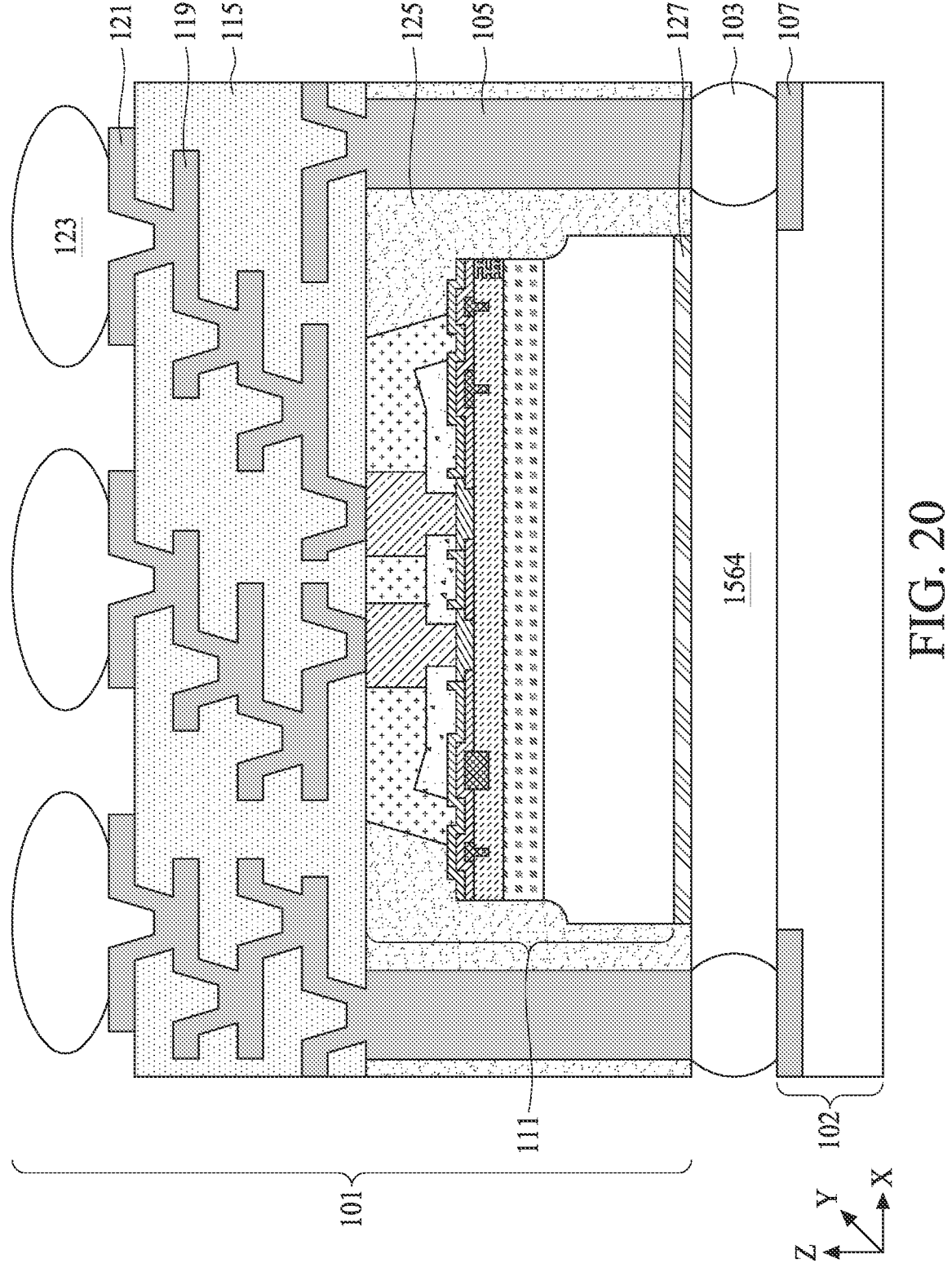

Referring to FIG. 2, in operation 245, redistribution layers are formed on the first IC chip and the conductive through-vias. For example, as shown in FIG. 19, RDLs 119 within dielectric layer 115 are formed on first IC chip 111 and conductive through-vias 105. The formation of RDLs 119 can be followed by the formation metal contact pads 121 and solder balls 123, as shown in FIG. 19.

Figure 21:
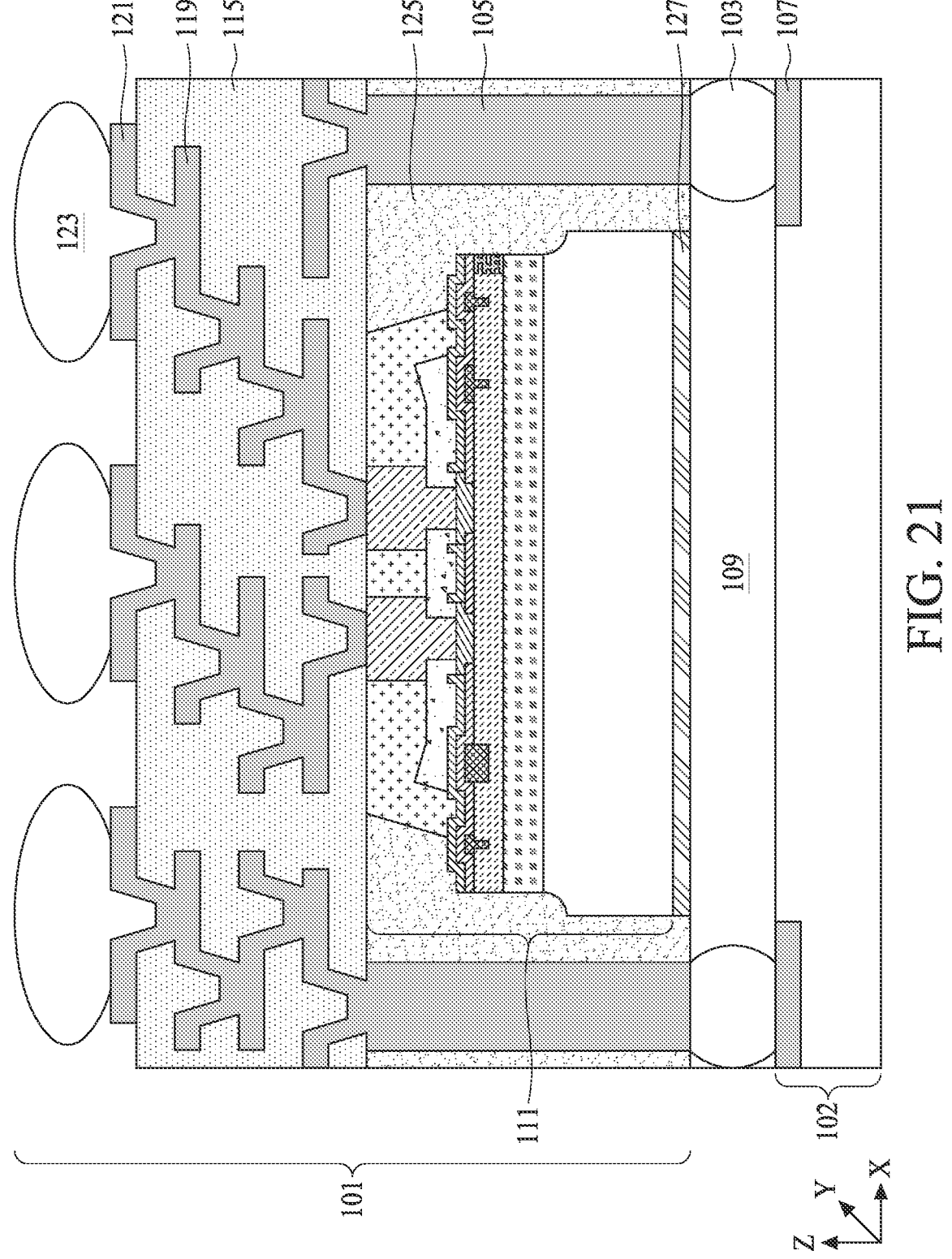

Referring to FIG. 2, in operation 250, the carrier substrate is de-bonded and an IC chip package is coupled to the conductive through-vias. For example, as described with reference to FIGS. 20-21, carrier substrate 1560 is de-bonded from first IC chip 111 and second IC chip package 102 is electrically coupled to conductive through-vias 105 with inter-package connectors 103. The coupling of second IC chip package can be followed by filling region 1564 (shown in FIG. 20) between first IC chip package 101 and second IC chip package 102 with the material of sealing layer 109, as shown in FIG. 21.

The present disclosure provides example structures of IC chip packages (e.g., integrated fan-out (InFO) packages) and example methods of fabricating the same to improve IC chip reliability for higher IC chip performance. In some embodiments, the IC chip packages (e.g., IC chip packages 100, 100\*, **100\*\*, or 100\*\*\*) can include one or more IC chips (e.g., IC chip 111), which include a device layer (e.g., device layer 129) of semiconductor devices (e.g., GAA FET 147 or finFET 147), interconnect structures (e.g., interconnect structure 131) disposed on the device layer, passivation layers (e.g., oxide layer 135 and nitride layer 137) disposed on the interconnect structures, and a stress buffer layer (e.g., stress buffer layer 145) disposed on the passivation layers. In some embodiments, the example methods (e.g., method 200) can include forming the device layer, interconnect structures, passivation layers, and stress buffer layer on a wafer followed by a three-stage die-singulation process and a packaging process. In some embodiments, a first stage of the die-singulation process (e.g., FIGS. 11-12) can include removing portions of the stress buffer layer from scribe lane areas (also referred to as "scribe line areas") using a lithographic process. In some embodiments, a second stage of the die-singulation process (e.g., FIG. 13) can include forming a trench in the wafer along the scribe lane by removing portions of the passivation layers, the interconnect structures, the device layer, and wafer from the scribe lane areas using a laser grooving process. In some embodiments, a third stage of the die-singulation process (e.g., FIG. 14**) can include dicing the wafer through the trench using a wafer saw process.

By using the three-stage die-singulation process having the lithographic process, a lower power density laser (e.g., about 30% to about 50% lower) can be used for the laser grooving process in the second stage compared to a laser used in a two-stage die-singulation process, which does not include a lithographic process. In the two-stage die-singulation process, a higher power density laser is used since the laser is used to remove portions of the stress buffer layer along with portions of the passivation layers, the interconnect structures, the device layer, and wafer prior to the wafer saw process. Lowering the laser power density during the three-stage die-singulation process can substantially reduce or eliminate thermal damages, such as delamination of dielectric layers in the interconnect structures and in the device layer, and formation of voids in metal lines of the interconnect structures in the IC chips formed. As a result, the IC chips formed after the three-stage die-singulation process have sharper edge profiles and about 10 times higher IC chip reliability than that of IC chips formed after the two-stage die-singulation process.

In some embodiments, a method includes forming a device layer on a substrate with a first die and a second die, forming an interconnect structure on the device layer, depositing an insulating layer on the interconnect structure, forming first and second conductive pads on the interconnect structure, forming first and second conductive vias on the first and second conductive pads, respectively, patterning a polymer layer to form first and second buffer layers with tapered side profiles on the first and second conductive vias, respectively, forming a trench in the substrate and between the first and second buffer layers, and dicing the substrate through the trench to separate the first die from the second die. Portions of the first and second conductive pads extend over the insulating layer.

In some embodiments, a method includes forming a device layer on a substrate with a first die and a second die, forming an interconnect structure on the device layer, depositing an insulating layer on the interconnect structure, and performing a die-singulation process. The die-singulation process includes performing a lithographic process on a polymer layer to form first and second buffer layers with tapered side profiles on the first and second dies, respectively, performing a laser grooving process to form a trench in the substrate and between the first and second buffer layers, and performing a dicing process through the trench to separate the first die from the second die.

In some embodiments, a structure includes a substrate, a device layer disposed on the substrate, an interconnect structure disposed on the device layer, an insulating layer disposed on the interconnect structure, a conductive pad on the interconnect structure, a conductive via disposed on the conductive pad, and a stress buffer layer with tapered side profiles disposed on the conductive via. Portions of the conductive pad extend over the insulating layer. Sidewalls of the stress buffer layer form angles greater than about 50 degrees and less than about 90 degrees with a top surface of the insulating layer.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
forming a device layer on a substrate with a first die and a second die;
forming an interconnect structure on the device layer;
depositing an insulating layer on the interconnect structure;
forming first and second conductive pads on the interconnect structure, wherein portions of the first and second conductive pads extend over the insulating layer;
depositing a nitride layer on the first and second conductive pads;
forming, through openings in the nitride layer, first and second conductive vias on the first and second conductive pads, respectively;
patterning a polymer layer to form first and second buffer layers with tapered side profiles on the first and second conductive vias, respectively;
forming a trench in the substrate and between the first and second buffer layers; and
dicing the substrate through the trench to separate the first die from the second die.

2. The method of claim 1, wherein patterning the polymer layer comprises forming the first and second buffer layers with sidewalls that form angles greater than about 50 degrees and less than about 90 degrees with a top surface of the insulating layer.

3. The method of claim 1, wherein patterning the polymer layer comprises forming the first buffer layer with a bottom edge that is a distance away from an edge of the first die, and wherein the distance is greater than about 1 μm and less than about 30 μm.

4. The method of claim 1, wherein patterning the polymer layer comprises forming the first buffer layer with a sidewall that is a distance away from a top edge of the first conductive via, and wherein the distance is greater than about 20 μm and less than about 100 μm.

5. The method of claim 1, wherein patterning the polymer layer comprises forming the first and second buffer layers on the first and second dies, respectively.

6. The method of claim 1, wherein patterning the polymer layer comprises performing a lithographic process on the polymer layer.

7. The method of claim 1, further comprising performing a curing process on the first and second buffer layers.

8. The method of claim 1, wherein forming the trench comprises removing portions of the device layer, the interconnect structure, the insulating layer, and the substrate with a laser having a power density of about 0.4 J/mm² to about 1.2 J/mm² and a wavelength of about 300 nm to about 500 nm.

9. The method of claim 1, wherein forming the trench comprises extending the trench into the substrate by a distance of about 1 µm to about 5 µm below the device layer.

10. The method of claim 1, further comprising:
forming a conductive through-via on a carrier substrate; and
forming redistribution layers on the first conductive via and the first buffer layer.

11. A method, comprising:
forming a device layer on a substrate with a first die and a second die;
forming an interconnect structure on the device layer;
depositing an insulating layer on the interconnect structure; and
performing a die-singulation process, comprising:
performing a lithographic process on a polymer layer to form first and second buffer layers with tapered side profiles on the first and second dies, respectively;
performing, using a lasing device, a laser grooving process to form a trench in the substrate and between the first and second buffer layers, wherein the trench comprises sidewalls with linear cross-sectional profiles and a bottom surface with a curved cross-sectional profile; and
performing, using a sawing device, a dicing process through the trench to separate the first die from the second die.

12. The method of claim 11, wherein performing the lithographic process on the polymer layer comprises forming the first and second buffer layers with sidewalls that form angles greater than 50 degrees and less than 90 degrees with a top surface of the insulating layer.

13. The method of claim 11, further comprising performing a curing process on the first and second buffer layers.

14. The method of claim 11, wherein depositing the insulating layer comprises depositing an oxide layer and a nitride layer.

15. The method of claim 11, further comprising:
forming a conductive through-via on a carrier substrate; and
forming redistribution layers on the first conductive via and the first buffer layer.

16. The method of claim 15, further comprising electrically coupling the conductive through-via to an integrated circuit chip package.

17. A method, comprising:
forming a device layer on a substrate;
forming an interconnect structure on the device layer;
depositing a polymer layer on the interconnect structure;
performing a lithographic process on the polymer layer to form first and second buffer layers with tapered side profiles;
forming, using a laser process, a trench in the substrate and between the first and second buffer layers, wherein the trench comprises sidewalls with linear cross-sectional profiles and a bottom surface with a curved cross-sectional profile; and
performing, using a mechanical saw, a dicing process through the trench to separate the substrate into a first die and a second die.

18. The method of claim 17, wherein forming the trench comprises extending the trench into the substrate by a distance of about 1 µm to about 5 µm below the device layer.

19. The method of claim 17, further comprising performing a curing process on the first and second buffer layers.

20. The method of claim 17, further comprising depositing an oxide layer and a nitride layer on the interconnect structure prior to depositing the polymer layer.

* * * * *